(12) United States Patent
Li et al.

(10) Patent No.: US 11,538,392 B2
(45) Date of Patent: *Dec. 27, 2022

(54) DISPLAY SUBSTRATE, METHOD FOR DRIVING THE SAME, DISPLAY DEVICE, AND FINE METAL MASK

(71) Applicant: BOE Technology Group Co., Ltd., Beijing (CN)

(72) Inventors: Zhenzhen Li, Beijing (CN); Kuo Sun, Beijing (CN); Lujiang Huangfu, Beijing (CN); Shanshan Bai, Beijing (CN)

(73) Assignee: BOE TECHNOLOGY GROUP CO LTD., Beijing (CN)

( * ) Notice: Subject to any disclaimer, the term of this patent is extended or adjusted under 35 U.S.C. 154(b) by 278 days.

This patent is subject to a terminal disclaimer.

(21) Appl. No.: 16/615,996

(22) PCT Filed: Mar. 20, 2019

(86) PCT No.: PCT/CN2019/078871
§ 371 (c)(1),
(2) Date: Nov. 22, 2019

(87) PCT Pub. No.: WO2019/242352
PCT Pub. Date: Dec. 26, 2019

(65) Prior Publication Data
US 2022/0059011 A1   Feb. 24, 2022

(30) Foreign Application Priority Data

Jun. 20, 2018   (CN) .......................... 201810639832.6

(51) Int. Cl.
G09G 3/20    (2006.01)
G07F 17/32   (2006.01)
G07F 17/34   (2006.01)

(52) U.S. Cl.
CPC ....... G09G 3/2074 (2013.01); G07F 17/3213 (2013.01); G07F 17/3218 (2013.01);
(Continued)

(58) Field of Classification Search
CPC ......... G09G 3/2074; G09G 2300/0452; G09G 2320/0233
See application file for complete search history.

(56) References Cited

U.S. PATENT DOCUMENTS 10,338,680 B2   8/2019  Zheng et al.
10,373,456 B2   8/2019  Henson et al.
(Continued)

FOREIGN PATENT DOCUMENTS

CN    103745688 A    4/2014
CN    103886809 A    6/2014
(Continued)

OTHER PUBLICATIONS

Office Action for corresponding Chinese Application No. 201810639832.6 dated Jul. 5, 2021.
(Continued)

*Primary Examiner* — Ricardo Osorio
(74) *Attorney, Agent, or Firm* — ArentFox Schiff LLP; Michael Fainberg

(57) ABSTRACT

Disclosed are a display substrate, a method for driving the same, a display device, and a fine metal mask, and a display area of the display substrate includes a first display sub-area in which pixels are distributed at a high density, and a second display sub-area in which pixels are distributed at a low density.

20 Claims, 20 Drawing Sheets

(52) U.S. Cl.
CPC ...... *G07F 17/3225* (2013.01); *G07F 17/3244* (2013.01); *G07F 17/3267* (2013.01); *G07F 17/34* (2013.01); *G09G 2300/0452* (2013.01); *G09G 2320/0233* (2013.01)

(56) References Cited

U.S. PATENT DOCUMENTS

| | | | |
|---|---|---|---|
| 10,388,680 B2 * | 8/2019 | Zheng | G09G 3/20 |
| 10,586,511 B2 * | 3/2020 | Yang | G09G 5/10 |
| 10,606,541 B2 * | 3/2020 | Yanagisawa | G06F 3/1438 |
| 2004/0227703 A1 | 11/2004 | Lamvik et al. | |
| 2006/0033422 A1 | 2/2006 | Chao | |
| 2006/0152531 A1 | 7/2006 | Lin et al. | |
| 2007/0262916 A1 | 11/2007 | Kee | |
| 2008/0088650 A1 | 4/2008 | Chen et al. | |
| 2008/0211757 A1 | 9/2008 | Weng et al. | |
| 2010/0039011 A1 | 2/2010 | Karaki et al. | |
| 2010/0066655 A1 | 3/2010 | Uh et al. | |
| 2012/0092397 A1 | 4/2012 | DeLuca | |
| 2014/0361262 A1 | 11/2014 | Kim | |
| 2015/0029208 A1 * | 1/2015 | Kim | G09G 3/2092 345/590 |
| 2015/0091953 A1 | 4/2015 | Wu | |
| 2015/0364526 A1 | 12/2015 | Peng et al. | |
| 2015/0371612 A1 | 12/2015 | DeLuca | |
| 2016/0027359 A1 | 1/2016 | Guo et al. | |
| 2016/0078807 A1 * | 3/2016 | Sun | G09G 3/3233 345/204 |
| 2016/0120005 A1 * | 4/2016 | Wu | H05B 33/26 313/505 |
| 2016/0155391 A1 * | 6/2016 | Takesue | G09G 3/3413 345/690 |
| 2016/0203748 A1 | 7/2016 | Matsueda et al. | |
| 2016/0217593 A1 | 7/2016 | Huang | |
| 2016/0267847 A1 | 9/2016 | Chen et al. | |
| 2017/0076654 A1 | 3/2017 | Wang | |
| 2017/0200428 A1 | 7/2017 | Song et al. | |
| 2017/0345402 A1 | 11/2017 | Zhou et al. | |
| 2018/0012566 A1 * | 1/2018 | Lin | G09G 5/10 |
| 2018/0026218 A1 * | 1/2018 | Kobayashi | G09G 3/2003 349/143 |
| 2018/0040676 A1 * | 2/2018 | Hack | G02B 27/0172 |
| 2018/0088260 A1 | 3/2018 | Jin et al. | |
| 2018/0165533 A1 | 6/2018 | Cho et al. | |
| 2018/0166553 A1 | 6/2018 | Cho et al. | |
| 2018/0350312 A1 | 12/2018 | Cao et al. | |
| 2018/0374426 A1 * | 12/2018 | Chen | G09G 3/3291 |
| 2019/0057644 A1 | 2/2019 | Yan | |
| 2019/0251895 A1 | 8/2019 | Zhang et al. | |
| 2019/0310724 A1 | 10/2019 | Yeke et al. | |
| 2019/0326366 A1 * | 10/2019 | Fan | H01L 27/3218 |
| 2019/0212788 A1 | 12/2019 | Harada et al. | |
| 2019/0373166 A1 | 12/2019 | Jia | |
| 2020/0034100 A1 * | 1/2020 | Fan | H01L 27/3288 |
| 2020/0043994 A1 | 2/2020 | Chen et al. | |
| 2020/0052059 A1 * | 2/2020 | Chen | H01L 27/3244 |
| 2020/0066809 A1 | 2/2020 | Liu | |
| 2020/0175905 A1 * | 6/2020 | Yamazaki | H05B 33/14 |
| 2021/0013277 A1 | 1/2021 | Liu | |
| 2021/0358379 A1 * | 11/2021 | Li | G09G 3/20 |
| 2021/0359053 A1 | 11/2021 | Shan et al. | |

FOREIGN PATENT DOCUMENTS

| | | | |
|---|---|---|---|
| CN | 104157246 A | 11/2014 | |
| CN | 104241295 A | 12/2014 | |
| CN | 104615395 A | 5/2015 | |
| CN | 104658499 A | 5/2015 | |
| CN | 104795016 A | 7/2015 | |
| CN | 205355055 U | 6/2016 | |
| CN | 205845956 U | 12/2016 | |
| CN | 106324875 A | 1/2017 | |
| CN | 106530994 A | 3/2017 | |
| CN | 206194742 U | * | 5/2017 |
| CN | 106921767 A | 7/2017 | |
| CN | 106935615 A | 7/2017 | |
| CN | 107422517 A | 12/2017 | |
| CN | 107633802 A | 1/2018 | |
| CN | 107808627 A | 3/2018 | |
| CN | 107819018 A | 3/2018 | |
| CN | 107819020 A | 3/2018 | |
| CN | 107844247 A | 3/2018 | |
| CN | 107920142 A | 4/2018 | |
| CN | 107945767 A | 4/2018 | |
| CN | 107948354 A | 4/2018 | |
| CN | 207264695 U | 4/2018 | |
| CN | 207338380 U | 5/2018 | |
| CN | 208507679 U | 2/2019 | |
| EP | 2843466 A1 | 3/2015 | |
| JP | 2016195782 A | 11/2016 | |
| KR | 20150107883 A | 9/2015 | |
| KR | 20180067196 A | 6/2018 | |
| WO | WO-2014114178 A1 * | 7/2014 | |

OTHER PUBLICATIONS

Wang et al. "Parameters Analysis of Single Pixel of Active Matrix Array for Amorphous Silicon Thin Film Transistor Organic LED" Semiconductor Optoelectronics, vol. 28, No. 2, Apr. 30, 2007.

Office Action for corresponding Indian Application No. 201947051749 dated Mar. 12, 2021.

Office Action for corresponding Chinese Application No. 201810638716.2 dated May 7, 2020.

Korean Office Action for corresponding Application No. 9-5-2021-048085262 dated Aug. 17, 2021.

ESSR for corresponding Application No. 19821969.3 dated Feb. 10, 2022.

Office Action for corresponding Korean Application No. 10-2020-7018044 dated Mar. 28, 2022.

U.S. Appl. No. 16/615,971 Non Final Office Action dated Feb. 3, 2022.

U.S. Appl. No. 16/615,971 Notice of Allowance dated May 11, 2022.

U.S. Appl. No. 16/644,791 Final Office Action dated Oct. 21, 2021.

U.S. Appl. No. 16/644,791 Notice of Allowance dated Feb. 12, 2021.

* cited by examiner

DISPLAY SUBSTRATE, METHOD FOR DRIVING THE SAME, DISPLAY DEVICE, AND FINE METAL MASK

This application is a National Stage of International Application No. PCT/CN2019/078871, filed on Mar. 20, 2019, which claims the benefits of Chinese Patent Application No. 201810639832.6, filed with the Chinese Patent Office on Jun. 20, 2018, and entitled "A display substrate, a method for driving the same, a display device, and a fine metal mask", both of which are hereby incorporated by reference in their entireties.

FIELD

This disclosure relates to the field of display technologies, and particularly to a display substrate, a method for driving the same, a display device, and a fine metal mask.

BACKGROUND

As the display technologies are developing, an all-screen panel with a high screen to panel ratio and an ultra-narrow bezel can greatly improve a visual effect over a general display panel, and thus has been widely favored. At present, a front camera, an earphone, a fingerprint recognition area, a physical button, etc., are typically arranged on the front face of a display device including an all-screen panel, e.g., a mobile phone, to photograph its user, to conduct a video session, to recognize a fingerprint, and to perform other functions. However the arrangement of these indispensable functional elements may hinder a screen to panel ratio from being improved.

SUMMARY

An embodiment of this disclosure provides a display substrate including a display area including a first display sub-area and a second sub-area, wherein:

a distribution density of pixels in the first display sub-area is higher than a distribution density of pixels in the second display sub-area.

Optionally in an embodiment of this disclosure, at least a part of sides of the second display sub-area coincide with at least a part of sides of the display area, and the other sides of the second display sub-area are surrounded by the first display sub-area.

Optionally in an embodiment of this disclosure, the first display sub-area and the second display sub-area are arranged in the row direction, or the first display sub-area and the second display sub-area are arranged in the column direction.

Optionally in an embodiment of this disclosure, the first display sub-area is arranged to surround the second display sub-area.

Optionally in an embodiment of this disclosure, the shape of the second display sub-area is one of a round, a drop shape, a rectangle, and a trapezia.

Optionally in an embodiment of this disclosure, the first display sub-area and the second display sub-area form a consecutive display area, and the shape of the display area is substantially a rectangle.

Optionally in an embodiment of this disclosure, the second display sub-area is located at a corner of the display area.

Optionally in an embodiment of this disclosure, the area of the second display sub-area is smaller than the area of the first display sub-area.

Optionally in an embodiment of this disclosure, the first display sub-area includes a plurality of first pixel elements and second pixel elements arranged adjacent to each other, wherein the first pixel elements include a first sub-pixel and a second sub-pixel, and the second pixel element includes a third sub-pixel and a second sub-pixel; and the second display sub-area includes a plurality of third pixel elements, and the third pixel elements include a first sub-pixel, a second sub-pixel, and a third sub-pixel arranged adjacent to each other.

Optionally in an embodiment of this disclosure, the sub-pixels in the second display sub-area are located in the same row as a part of the sub-pixels in the first display sub-area.

Optionally in an embodiment of this disclosure, the sub-pixels in the second display sub-area are located in the same column as a part of the sub-pixels in the first display sub-area.

Optionally in an embodiment of this disclosure, a light-emitting area of a first sub-pixel in the second display sub-area is not smaller than a light-emitting area of a first sub-pixel in the first display sub-area;

a light-emitting area of a second sub-pixel in the second display sub-area is not smaller than a light-emitting area of a second sub-pixel in the first display sub-area; and a light-emitting area of a third sub-pixel in the second display sub-area is not smaller than a light-emitting area of a third sub-pixel in the first display sub-area.

Optionally in an embodiment of this disclosure, the plurality of third pixel elements are arranged in a matrix in the second display sub-area.

Optionally in an embodiment of this disclosure, the plurality of third pixel elements are arranged in a tessellated pattern in the second display sub-area.

Optionally in an embodiment of this disclosure, the first sub-pixel, the second sub-pixel, and the third sub-pixel in the third pixel element are arranged successively in the same row or column in the second display sub-area.

Optionally in an embodiment of this disclosure, in the third pixel element in the second display sub-area, the first sub-pixel and the third sub-pixel are arranged in the same row, and the second sub-pixel is located in an adjacent row to the row in which the first sub-pixel and the third sub-pixel are located.

Optionally in an embodiment of this disclosure, in the same third pixel element, an orthographical projection of the center of the second sub-pixel onto a line connecting the center of the first sub-pixel with the center of the third sub-pixel lies between the center of the first sub-pixel, and the center of the third sub-pixel.

Optionally in an embodiment of this disclosure, in the second display sub-area, the sub-pixels in two third pixel elements adjacent in the row direction are arranged in the same order in the row direction, and the sub-pixels in two third pixel elements adjacent in the column direction are arranged in opposite orders in the row direction.

Optionally in an embodiment of this disclosure, the sub-pixels in the third pixel elements in the second display sub-area are arranged in the same order.

Optionally in an embodiment of this disclosure, in the second display sub-area, the sub-pixels in the third pixel elements in the same column are arranged in the same order; and the sub-pixels in the third pixel elements in two adjacent columns are arranged in opposite orders.

Optionally in an embodiment of this disclosure, the shapes of the first sub-pixels, the second sub-pixels, and the third sub-pixels are substantially the same in the second display sub-area.

Optionally in an embodiment of this disclosure, a light-emitting area of a second sub-pixel is smaller than or substantially equal to a light-emitting area of a first sub-pixel, and a light-emitting area of a second sub-pixel is smaller than or substantially equal to a light-emitting area of a third sub-pixel, in the second display sub-area.

Optionally in an embodiment of this disclosure, a light-emitting area of a first sub-pixel is substantially equal to a light-emitting area of a third sub-pixel in the second display sub-area.

Optionally in an embodiment of this disclosure, the first pixel elements and the second pixel elements are arranged alternately in the column direction, and the first pixel elements and the second pixel elements are arranged alternately in the row direction, in the first display sub-area.

Optionally in an embodiment of this disclosure, the second sub-pixel and the first sub-pixel in the first pixel elements are arranged in the same row, and the second sub-pixel and the third sub-pixel in the second pixel elements are arranged in the same row, in the first display sub-area; and for the first pixel element and the second pixel element adjacent in the row direction, the second sub-pixel in the first pixel element is not immediately adjacent to the second sub-pixel in the second pixel element.

Optionally in an embodiment of this disclosure, a light-emitting area of a first sub-pixel, a light-emitting area of a second sub-pixel, and a light-emitting area of a third sub-pixel are substantially the same in the first display sub-area.

Optionally in an embodiment of this disclosure, the second sub-pixel and the first sub-pixel in the first pixel elements are staggered in rows and columns, and the second sub-pixel and the third sub-pixel in the second pixel elements are arranged in the same row; and the first pixel element and the second pixel element adjacent in the column direction are a group of pixels, and in the same group of pixels, the second sub-pixel in the first pixel element, and the third sub-pixel in the second pixel element are arranged in the same row, and the second sub-pixel in the first pixel element, and the second sub-pixel in the second pixel element are located in the same column.

Optionally in an embodiment of this disclosure, a light-emitting area of a second sub-pixel is not larger than a light-emitting area of a first sub-pixel, and a light-emitting area of a second sub-pixel is not larger than a light-emitting area of a third sub-pixel, in the first display sub-area.

Optionally in an embodiment of this disclosure, two second sub-pixels in the same group of pixels are arranged adjacent to each other in the column direction, and the two second sub-pixels are arranged symmetric in the row direction.

Optionally in an embodiment of this disclosure, the shapes of the first sub-pixel and the third sub-pixel are substantially the same, and the shape of a combination of two second sub-pixels is substantially the same as the shape of the first sub-pixel, in the same group of pixels.

Optionally in an embodiment of this disclosure, the sub-pixels in the first pixel elements are arranged in the same order, and the sub-pixels in the second pixel elements are arranged in the same order, in the first display sub-area.

Optionally in an embodiment of this disclosure, the shape of at least one of a first sub-pixel and a third sub-pixel in the second display sub-area is substantially the same as the shape of a first sub-pixel in the first display sub-area.

Optionally in an embodiment of this disclosure, the shape of one of a first sub-pixel and a second sub-pixel in the first display sub-area is substantially the same as the shape of a second sub-pixel in the second display sub-area.

Optionally in an embodiment of this disclosure, the shape of the first sub-pixel is at least one of a rectangle and a hexagon.

Correspondingly an embodiment of this disclosure further provides a display device including the display substrate above.

Optionally in an embodiment of this disclosure, the display device further includes a driver configured to drive the display substrate, wherein the driver is configured:

to receive raw image data;

for the sub-pixels in the first display sub-area, to determine a target grayscale of the sub-pixel according to an initial grayscale of a sub-pixel in the raw image data, corresponding to the sub-pixel;

for the sub-pixels in the second display sub-area, to determine a target grayscale of the sub-pixel according to a light-emitting area of the sub-pixel, the distribution density of pixels in the second display sub-area, and an initial grayscale of a sub-pixel in the raw image data, corresponding to an area including the sub-pixel; and to drive the respective sub-pixels in the display substrate to display at their target grayscales.

Correspondingly an embodiment of this disclosure further provides a method for driving the display substrate, the method including:

to drive the display substrate, the method including:

receiving raw image data;

for the sub-pixels in the first display sub-area, determining a target grayscale of the sub-pixel according to an initial grayscale of a sub-pixel in the raw image data, corresponding to the sub-pixel;

for the sub-pixels in the second display sub-area, determining a target grayscale of the sub-pixel according to a light-emitting area of the sub-pixel, the distribution density of pixels in the second display sub-area, and an initial grayscale of a sub-pixel in the raw image data, corresponding to an area including the sub-pixel; and driving the respective sub-pixels in the display substrate to display at their target grayscales.

Optionally in an embodiment of this disclosure, determining for the sub-pixels in the first display sub-area the target grayscale of the sub-pixel includes:

determining a target grayscale X corresponding to a first sub-pixel in the first display sub-area in the equation of $$X = \left( \frac{x_1^{Gamma} + x_2^{Gamma}}{2} \right)^{\frac{1}{Gamma}},$$

wherein Gamma represents a gamma value of the display substrate, and $x_1$ and $x_2$ represent initial grayscales of two first sub-pixels in the raw image data, which correspond to the first sub-pixel respectively;

determining a target grayscale Y of a second sub-pixel in the first display sub-area as an initial grayscale y of a second sub-pixel in the raw image data, corresponding to the second sub-pixel; and determining a target grayscale Z corresponding to a third sub-pixel in the first display sub-area in the equation of $$Z = \left( \frac{z_1{}^{Gamma} + z_2{}^{Gamma}}{2} \right)^{\frac{1}{Gamma}},$$

wherein $z_1$ and $z_2$ represent initial grayscales of two third sub-pixels in the raw image data, which correspond to the third sub-pixel respectively.

Optionally in an embodiment of this disclosure, determining for the sub-pixels in the second display sub-area the target grayscale of the sub-pixel includes:

determining the target grayscale X corresponding to the sub-pixel in the equation of $$X = k * s * \rho \left( \frac{x_1{}^{Gamma} + x_2{}^{Gamma} + \ldots + x_n{}^{Gamma}}{n} \right)^{\frac{1}{Gamma}},$$

wherein n is any integer ranging from 1 to N, N is the number of sub-pixels in the raw image data, which correspond to the sub-pixel, Gamma represents a gamma value of the display substrate, s represents the ratio of a light-emitting area of a sub-pixel in the first display sub-area to a light-emitting area of a sub-pixel in the second display sub-area, ρ represents the ratio of the distribution density of pixels in the first display sub-area to the distribution density of pixels in the second display sub-area, k is an error adjustment coefficient, and $x_n$ is an initial grayscale of the n-th sub-pixel in the raw image data, corresponding to the sub-pixel.

Correspondingly an embodiment of this disclosure further provides a fine metal mask for fabricating the display substrate above, wherein the fine metal mask includes a plurality of opening areas corresponding in shape and position to the first sub-pixels, the second sub-pixels, or the third sub-pixels.

DETAILED DESCRIPTION OF THE EMBODIMENTS

Figure 1A:
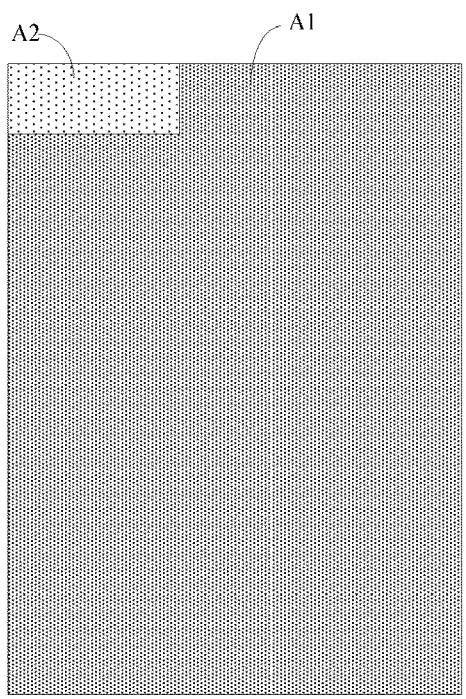
FIG. 1a is a first schematic structural diagram of a display substrate according to an embodiment of this disclosure.

The embodiments of this disclosure provide a display substrate, a method for driving the same, a display device, and a fine metal mask. In order to make the objects, technical solutions, and advantages of this disclosure more apparent, this disclosure will be described below in further details with reference to the drawings. Apparently the embodiments to be described are only a part but not all of the embodiments of this disclosure. Based upon the embodiments here of this disclosure, all the other embodiments which can occur to those ordinarily skilled in the art without any inventive effort shall come into the scope of this disclosure as claimed.

The shapes and the sizes of respective components in the drawings are not intended to reflect any real proportion, but only intended to illustrate the disclosure of this application.

As illustrated in FIG. 1a to FIG. 1i, a display substrate according to an embodiment of this disclosure includes a display area including a first display sub-area A1 and a second sub-area A2, where a distribution density of pixels in the first display sub-area A1 is higher than a distribution density of pixels in the second display sub-area A2.

In the display substrate according to an embodiment of this disclosure, the display area includes the first display sub-area in which pixels are distributed at a high density (e.g., a high resolution), and the second display sub-area in which pixels are distributed at a low density (e.g., a low resolution). Since the distribution density of pixels in the second display sub-area is lower, a camera and other elements can be arranged in the second display sub-display area, that is, the distribution density of the local pixels can be lowered to thereby improve the transmittivity of a screen so as to improve a screen to panel ratio of the display substrate.

It shall be noted that the distribution density of pixels can refer to the number of pixels arranged uniformly in a unit of area. If there are a large number of pixels arranged in a unit of area, then there will be a high distribution density of pixels, and thus a high resolution; and if there are a small number of pixels arranged in a unit of area, then there will be a low distribution density of pixels, and thus a low resolution.

Furthermore in an embodiment of this disclosure, the distribution density of pixels is particularly calculated in the equation of $$\rho = \frac{\sqrt{x^2 + y^2}}{S},$$

where ρ represents the distribution density of pixels, x represents the number of display elements in the row direction, y represents the number of display elements in the column direction, and S represents the area of a screen.

In a particular implementation, in the display substrate according to an embodiment of this disclosure, the number of second display sub-areas may be one or more; and the first display sub-area may be a consecutive area, or may be an inconsecutive area, dependent upon a real application environment, although an embodiment of the invention will not be limited thereto.

In a particular implementation, in the display substrate according to an embodiment of this disclosure, as illustrated in FIG. 1a to FIG. 1g, at least a part of sides of the second display sub-area A2 coincide with at least a part of sides of the display area, and the other sides of the second display sub-area A2 are surrounded by the first display sub-area A1, so that the second display sub-area A2 can be arranged at the edge of the display area.

Figure 1B:
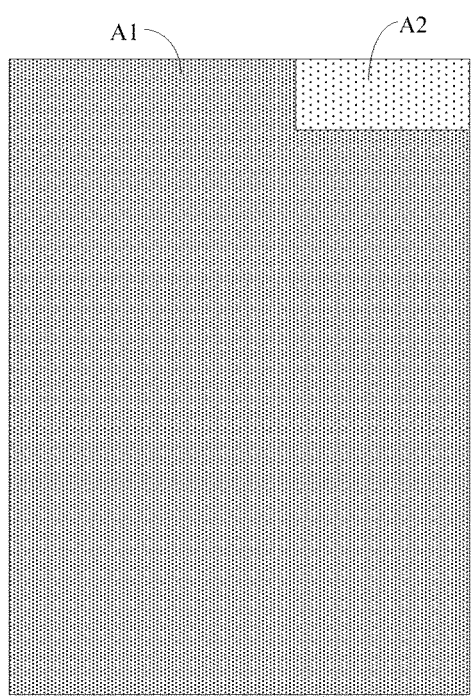
FIG. 1b is a second schematic structural diagram of the display substrate according to an embodiment of this disclosure.
Figure 1C:
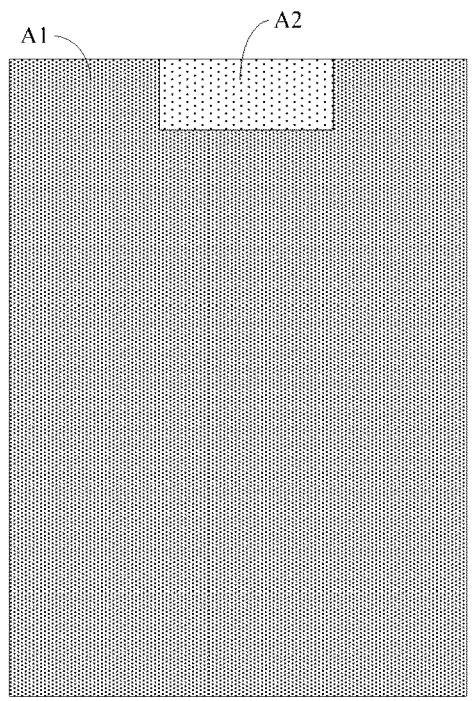
FIG. 1c is a third schematic structural diagram of the display substrate according to an embodiment of this disclosure.
Figure 1D:
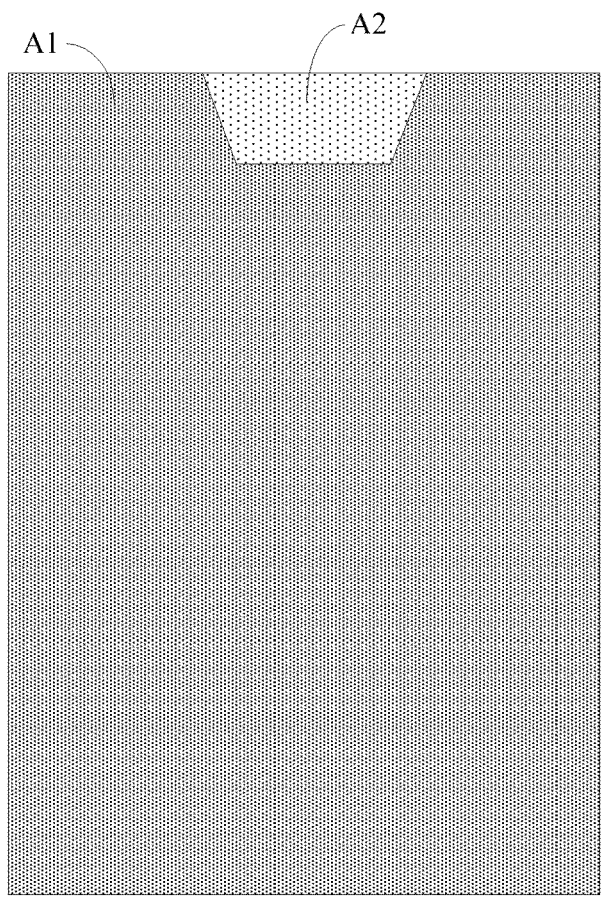
FIG. 1d is a fourth schematic structural diagram of the display substrate according to an embodiment of this disclosure.
Figure 1E:
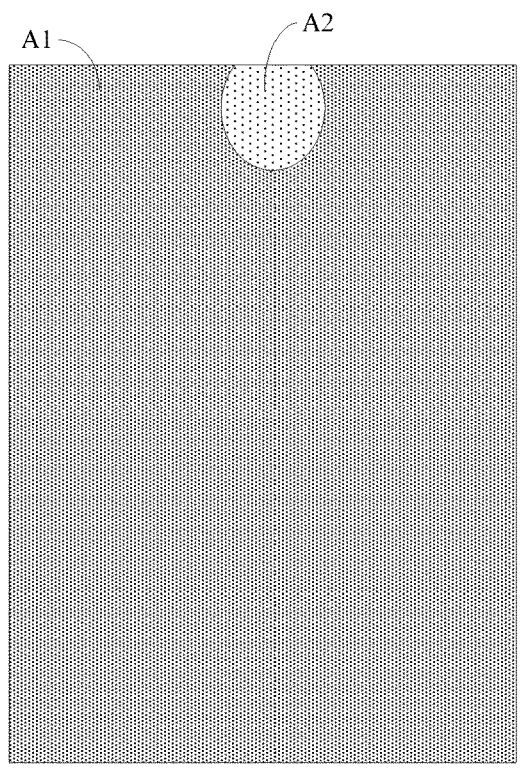
FIG. 1e is a fifth schematic structural diagram of the display substrate according to an embodiment of this disclosure.
Figure 1F:
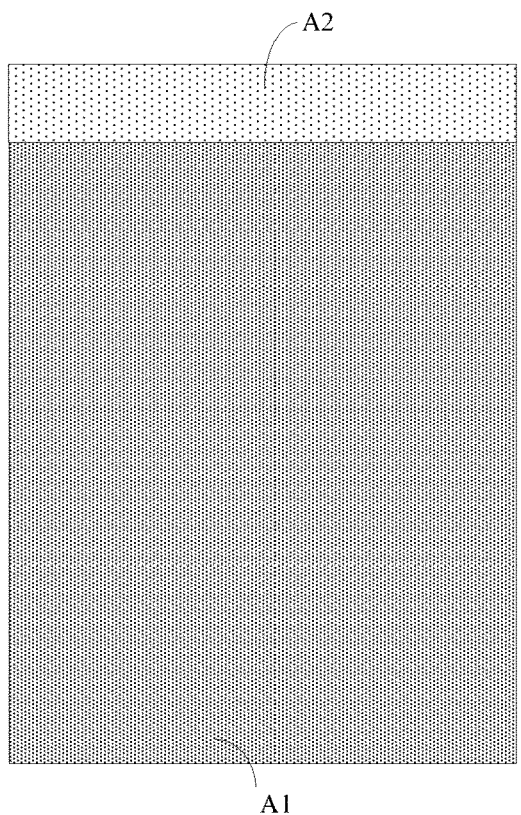
FIG. 1f is a sixth schematic structural diagram of the display substrate according to an embodiment of this disclosure.
Figure 1G:
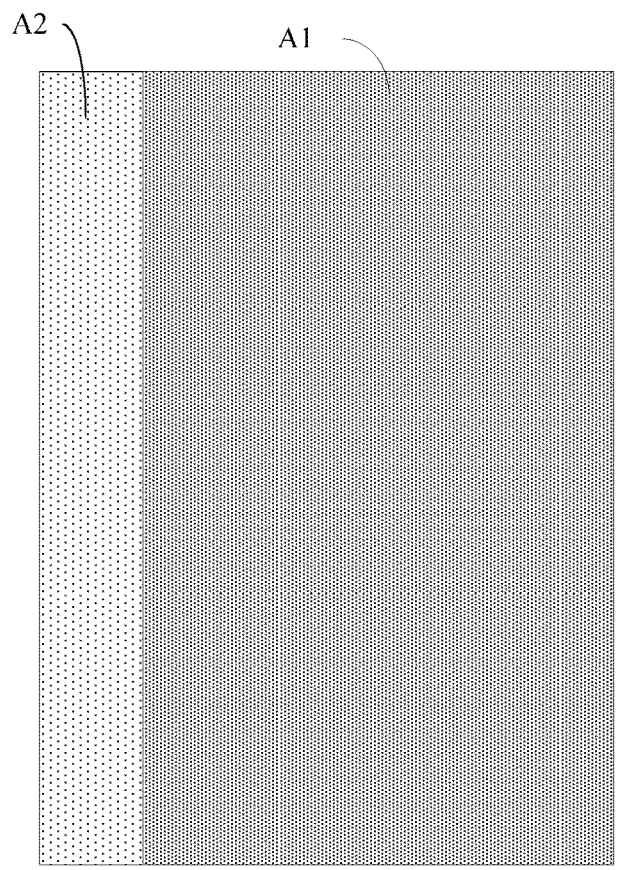
FIG. 1g is a seventh schematic structural diagram of the display substrate according to an embodiment of this disclosure.
Figure 1H:
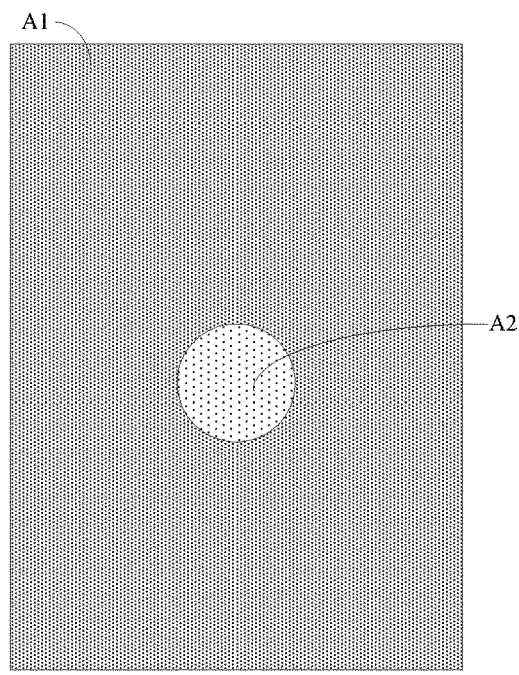
FIG. 1h is an eighth schematic structural diagram of the display substrate according to an embodiment of this disclosure.
Figure 1I:
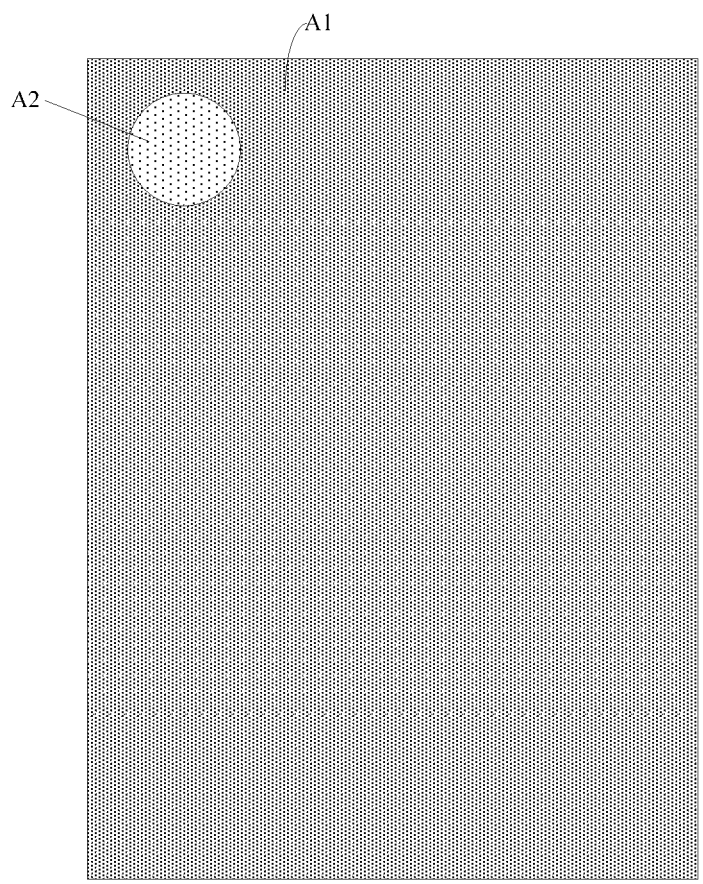
FIG. 1i is a ninth schematic structural diagram of the display substrate according to an embodiment of this disclosure.

In a particular implementation, in the display substrate according to an embodiment of this disclosure, as illustrated in FIG. 1h and FIG. 1i, the first display sub-area A1 is arranged to surround the second display sub-area A2 so that the second display sub-area A2 can be arranged in the display area.

Furthermore in a particular implementation, the shape of the second display sub-area A2 can be arranged as a regular shape, and as illustrated in FIG. 1a to FIG. 1c, for example, the second display sub-area A2 can be arranged as a rectangle, where a top corner of the rectangle can be a right angle or can be an arc angle. As illustrated in FIG. 1d, the second display sub-area A2 can be arranged as a trapezium, where a top corner of the trapezium can be a normal angle or can be an arc angle. As illustrated in FIG. 1h and FIG. 1i, the second display sub-area A2 can be arranged as a round. Of course, the shape of the second display sub-area A2 can be arranged as an irregular shape. As illustrated in FIG. 1e, for example, the second display sub-area A2 can be arranged as a drop shape. Of course, the shape of the second display sub-area can be designed according to the shape of an element arranged in the second display sub-area in a real application, although an embodiment of this disclosure will not be limited thereto.

Optionally in the display substrate according to an embodiment of this disclosure, as illustrated in FIG. 1a to FIG. 1i, the first display sub-area A1 and the second display sub-area A2 form the consecutive display area, and the shape of the display area is substantially rectangular, so that the first display sub-area A1 and the second display sub-area A2 can be formed as complementary patterns to form the consecutive display area. Furthermore, for example, if each top corner of the display area is a right angle, then the display area will be a rectangle, or if each top corner of the display area is an arc angle, then the shape of the display area will be substantially rectangular.

In a particular implementation, in the display substrate according to an embodiment of this disclosure, a relative positional relationship between the first display sub-area and the second display sub-area, and their shapes will not be limited to any particular relative positional relationship and shapes, but can be arranged according to a screen design of the display substrate. For a mobile phone, for example, the second display sub-area A2 can be arranged at the top-left corner of the first display sub-area A1 as illustrated in FIG. 1a. The second display sub-area A2 can be arranged at the top-right corner of the first display sub-area A1 as illustrated in FIG. 1b. The second display sub-area A2 can be arranged at the middle of the top of the first display sub-area A1 as illustrated in FIG. 1c to FIG. 1e. The first display sub-area A1 and the second display sub-area A2 can be arranged in the row direction as illustrated in FIG. 1f, where the second display sub-area A2 can be located above or below the first display sub-area A1. In this way, a sensor, e.g., a sensor for recognizing a human face (e.g., an infrared sensor, etc.), can be further arranged in the second display sub-area A2. The first display sub-area A1 and the second display sub-area A2 can be arranged in the column direction as illustrated in FIG. 1g, where the second display sub-area A2 can be located to the left or right of first display sub-area A1. In this way, a sensor, e.g., a sensor for recognizing a human face (e.g., an infrared sensor, etc.), can be further arranged in the second display sub-area A2. The second display sub-area A2 can be arranged at the center of the first display sub-area A1 as illustrated in FIG. 1h. The second display sub-area A2 can be arranged at a corner (e.g., the top-left corner) of the display area as illustrated in FIG. 1i. Of course, the particular position of the second display area A2 can be determined according to a real application environment in a real application, although an embodiment of the invention will not be limited thereto.

In a particular implementation, in the display substrate according to an embodiment of this disclosure, the distribution density of pixels in the second display sub-area is determined according to an element arranged in the second display sub-area, and a display demand, although an embodiment of the invention will not be limited thereto. For example, a camera is arranged in the second display sub-area, and if the distribution density of pixels is too high, then a good display effect will be guaranteed, but a definition of photographing may be degraded, or if the distribution density of pixels is too low, then a high definition of photographing will be guaranteed, but the display effect may be degraded. In a particular implementation, there is such an attainable resolution of the existing display substrate that the distribution density of pixels in the second display sub-area is generally no lower than the distribution density of pixels in the first display sub-area by a factor of ¼. For example, the distribution density of pixels in the second display sub-area is ½, ⅓, or ¼ of the distribution density of pixels in the first display sub-area. Of course, if the resolution of the display substrate is made higher, then the ratio of the distribution density of pixels in the second display sub-area to the distribution density in the first display sub-area may be set smaller.

In a particular implementation, in the display substrate according to an embodiment of this disclosure, as illustrated in FIG. 1a to FIG. 1i, the area of the second display sub-area A2 can be smaller than the area of the first display sub-area A1. Of course, the area of the second display sub-area can be designed according to an element arranged in the second display sub-area in a real application, although an embodiment of this disclosure will not be limited thereto.

Pixel elements are generally arranged in the display area, and each pixel element includes a plurality of sub-pixels; and a pixel in an embodiment of this disclosure may refer to a combination of sub-pixels which can display an image at a pixel point independently, and for example, a pixel may refer to a pixel element. Optionally in the display substrate according to an embodiment of this disclosure, as illustrated in FIG. 2 to FIG. 13, the first display sub-area A1 includes a plurality of first pixel elements 10 and second pixel elements 20 arranged adjacent to each other, where each first pixel element 10 includes a first sub-pixel 1 and a second sub-pixel 2, and each second pixel element 20 includes a third sub-pixel 3 and a second sub-pixel 2. In order to display an image, the number of pixels in the first display sub-area A1 is equal to the sum of the number of first pixel elements 10, and the number of second pixel elements 20, that is, the pixels are arranged in a pan tile pattern in the first display sub-area A1, and the image can be displayed at the pixel elements at a higher resolution than a physical resolution by borrowing the sub-pixels in their adjacent pixel elements.

The second display sub-area A2 includes a plurality of third pixel elements 30, and each third pixel element 30 includes a first sub-pixel 1, a second sub-pixel 2, and a third sub-pixel 3 arranged adjacent to each other. In order to display an image, the number of pixels in the second display sub-area A2 is equal to the number of third pixel elements 30, that is, a physical resolution of the pixels in the second display sub-area A2 is the display definition thereof. Moreover in this embodiment, only an arrangement pattern of the third pixel elements 30 in the second display sub-area is illustrated, but a distribution density of the third pixel elements 30 in the second display sub-area A2 will not be limited to any particular distribution density.

It shall be noted that each pixel element can be a combination of sub-pixels at a pixel point, and for example, can be a combination of three, three, four or more of red, green, and blue sub-pixels, or each pixel element can be a combination of repeating elements or pixels, e.g., a combination of red, green, and blue sub-pixels.

In a particular implementation, in the display substrate according to an embodiment of this disclosure, two adjacent pixel elements refer to two pixel elements between which there is not any other pixel element. Two adjacent sub-pixels refer to two sub-pixels between which there is not nay other sub-pixel.

It shall be noted that in the display substrate according to an embodiment of this disclosure, since there is a limited space at the edge of a display sub-area, the arrangement of sub-pixels in the first display sub-area, and the arrangement of sub-pixels in the second display sub-area generally refer to the arrangements of sub-pixels inside the display sub-areas, and there may be a different arrangement of some sub-pixels at the edge of the display sub-area, although an embodiment of this disclosure will not be limited thereto.

In a particular implementation, the first sub-pixels, the second sub-pixels, and the third sub-pixels are generally one of red, green, and blue sub-pixels respectively. Optionally in the display substrate according to an embodiment of this disclosure, the second sub-pixels are green sub-pixels, the first sub-pixels are red or blue sub-pixels, and the third sub-pixels are blue or red sub-pixels.

Figure 2:
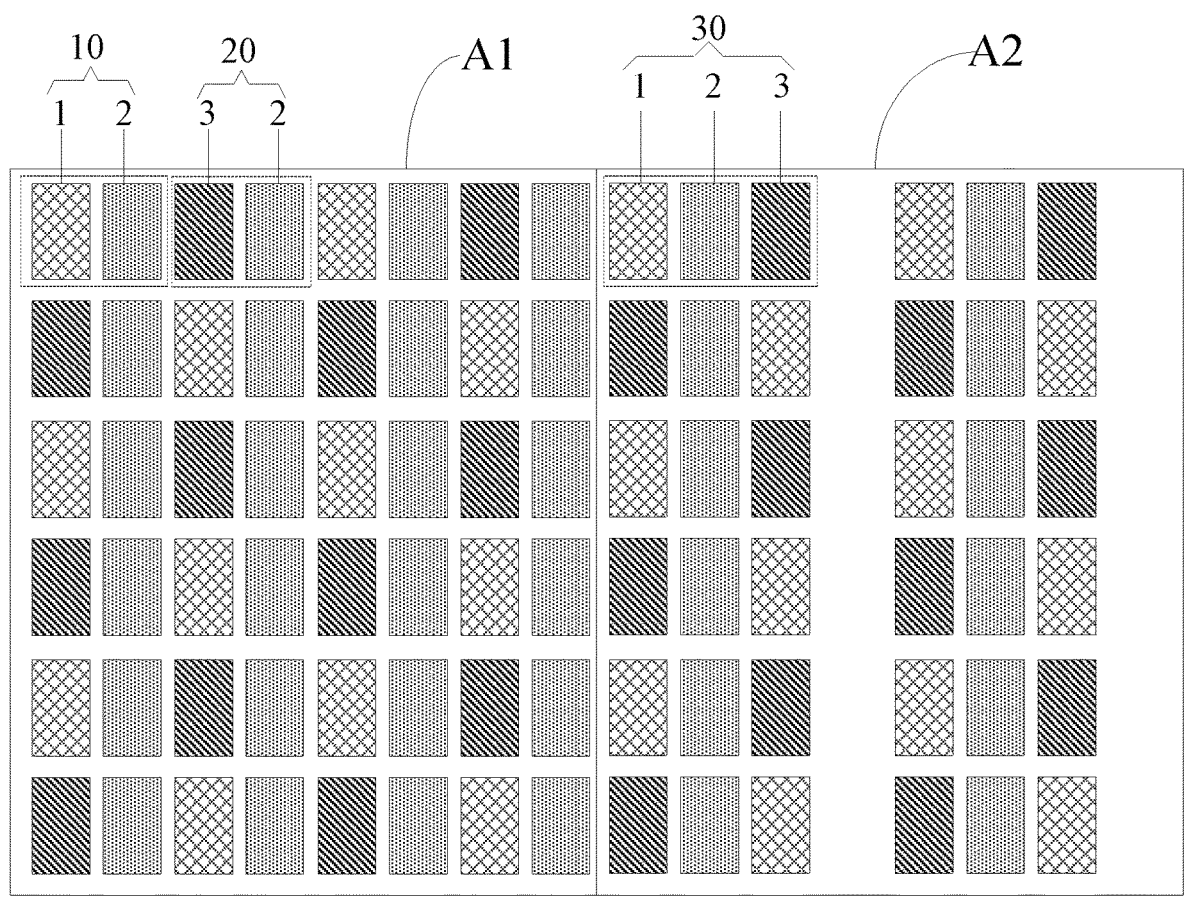
FIG. 2 is a first schematic structural diagram of a part of the display substrate according to an embodiment of this disclosure.
Figure 3:
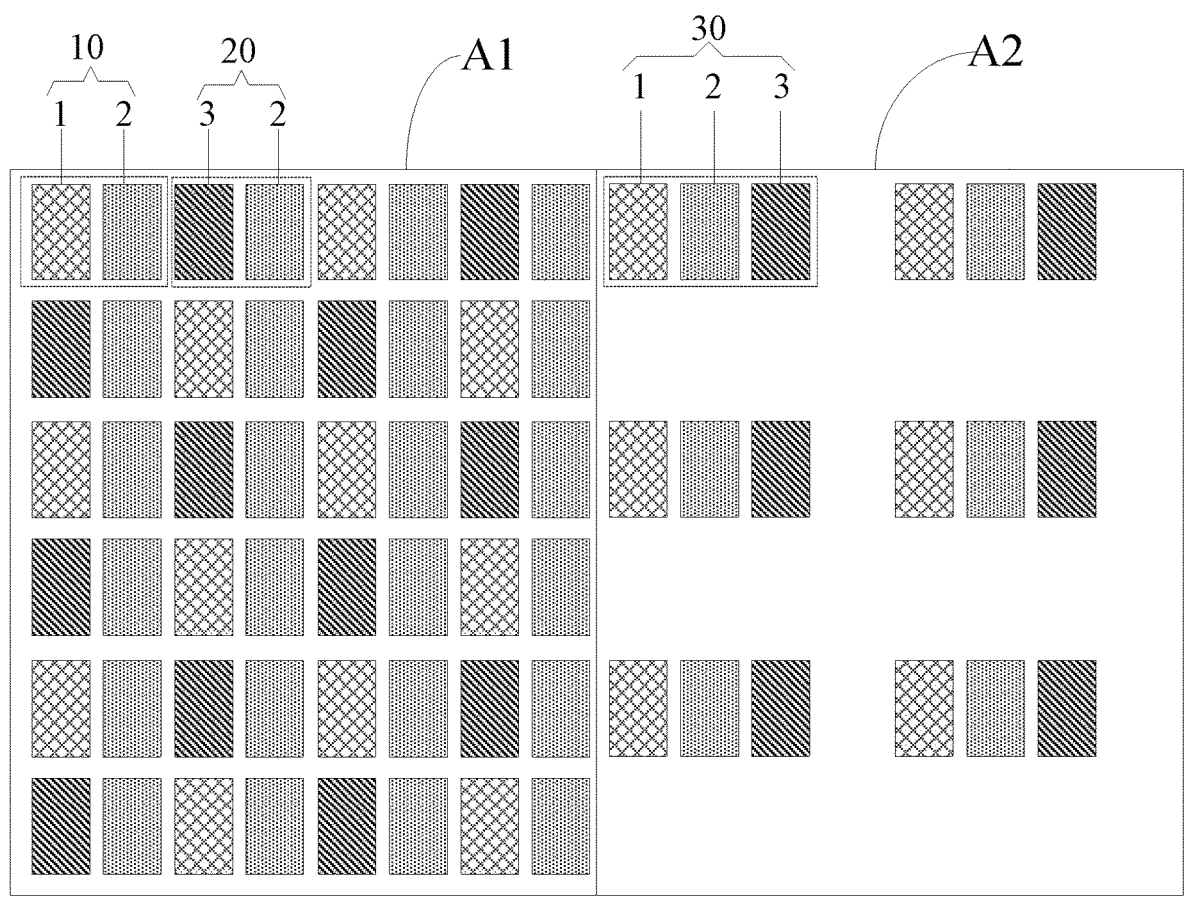
FIG. 3 is a second schematic structural diagram of a part of the display substrate according to an embodiment of this disclosure.
Figure 4:
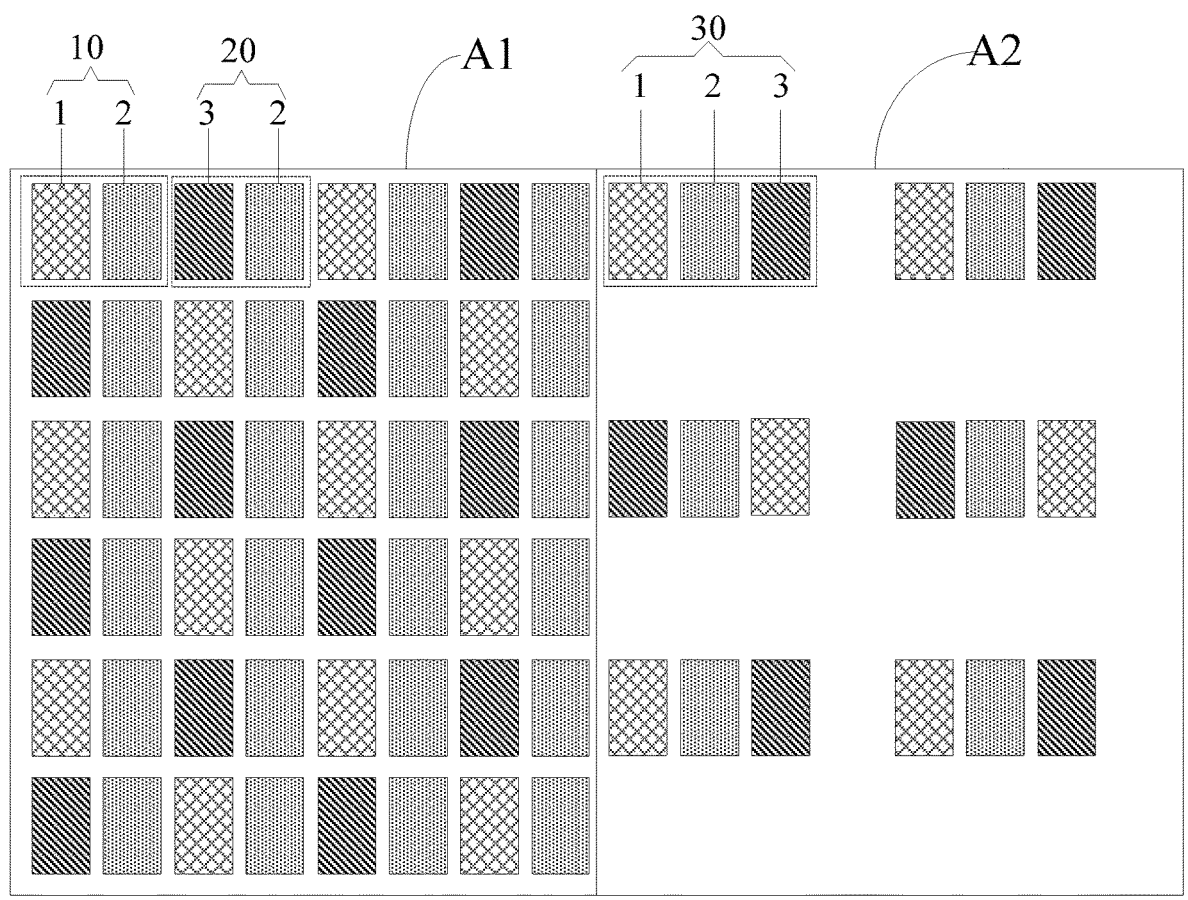
FIG. 4 is a third schematic structural diagram of a part of the display substrate according to an embodiment of this disclosure.

Optionally in the display substrate according to an embodiment of this disclosure, as illustrated in FIG. 2 to FIG. 5, the sub-pixels in the second display sub-area A2 can be located in the same row as a part of the sub-pixels in the first display sub-area A1 so that the sub-pixels in the second display sub-area A2 correspond in row direction to the sub-pixels in the first display sub-area A1 instead of being arranged in a different row or column from the latter sub-pixels. In this way, the display substrate is fabricated in such a way that equivalently a part of the sub-pixels in the second display sub-area in a sub-pixel mask originally arranged regularly throughout the display area are removed, thus making it relatively easy to perform a fabrication process. Optionally in the display substrate according to an embodiment of this disclosure, as illustrated in FIG. 6 to FIG. 13, the sub-pixels in the second display sub-area A2 can be located in the same column as a part of the sub-pixels in the first display sub-area A1 so that the sub-pixels in the second display sub-area A2 correspond in column direction to the sub-pixels in the first display sub-area A1 instead of being arranged in a different row or column from the latter sub-pixels. In this way, the display substrate is fabricated in such a way that a part of the sub-pixels in the second display sub-area in a sub-pixel mask originally arranged regularly throughout the display area are removed, thus making it relatively easy to perform a fabrication process. As illustrated in FIG. 2, for example, equivalently a half of the second sub-pixels in the second display sub-area A2 are removed as compared with the first display sub-area A1, so the resolution of the second display sub-area A2 is ½ of the resolution of the first display sub-area A1. As illustrated in FIG. 3, for example, equivalently ¾ of the second sub-pixels in the second display sub-area A2 are removed as compared with the first display sub-area A1, so the resolution of the second display sub-area A2 is ¼ of the resolution of the first display sub-area A1.

Optionally in the display substrate according to an embodiment of this disclosure, as illustrated in FIG. 2 to FIG. 8, a light-emitting area of a first sub-pixel 1 in the second display sub-area A2 is substantially equal to a light-emitting area of a first sub-pixel 1 in the first display sub-area A1, and a light-emitting area of a third sub-pixel 3 in the second display sub-area A2 is substantially equal to a light-emitting area of a third sub-pixel 3 in the first display sub-area A1. As illustrated in FIG. 2 to FIG. 7, a light-emitting area of a second sub-pixel 2 in the second display sub-area A2 is substantially equal to a light-emitting area of a second sub-pixel 2 in the first display sub-area A1.

In a particular implementation, the distribution density of pixels in the second display sub-area is lower than the distribution density of pixels in the first display sub-area, so in order to display an image, brightness in the second distribution density of pixels is lower than brightness in the first distribution density of pixels so that there may be an apparent dark strip visible to human eyes, at the interface between the first display sub-area and the second display sub-area. Optionally in order to alleviate the dark strip, in the display substrate according to an embodiment of this disclosure, as illustrated in FIG. 9 to FIG. 13, a light-emitting area of a first sub-pixel 1 in the second display sub-area A2 is larger than a light-emitting area of a first sub-pixel 1 in the first display sub-area A1, a light-emitting area of a second sub-pixel 2 in the second display sub-area A2 is larger than a light-emitting area of a second sub-pixel 2 in the first display sub-area A1, and a light-emitting area of a third sub-pixel 1 in the second display sub-area A2 is larger than a light-emitting area of a third sub-pixel 1 in the first display sub-area A1, that is, the light-emitting areas of the sub-pixels in the second display sub-area A2 can be increased to thereby lower the difference in brightness between the second display sub-area A2 and the first display sub-area A1 so as to alleviate the dark strip at the interface between the second display sub-area A2 and the first display sub-area A1.

Optionally in the display substrate according to an embodiment of this disclosure, a plurality of third pixel elements 30 are arranged in a matrix in the second display sub-area A2 as illustrated in FIG. 2 to FIG. 5, and FIG. 7 to FIG. 10.

Figure 6:
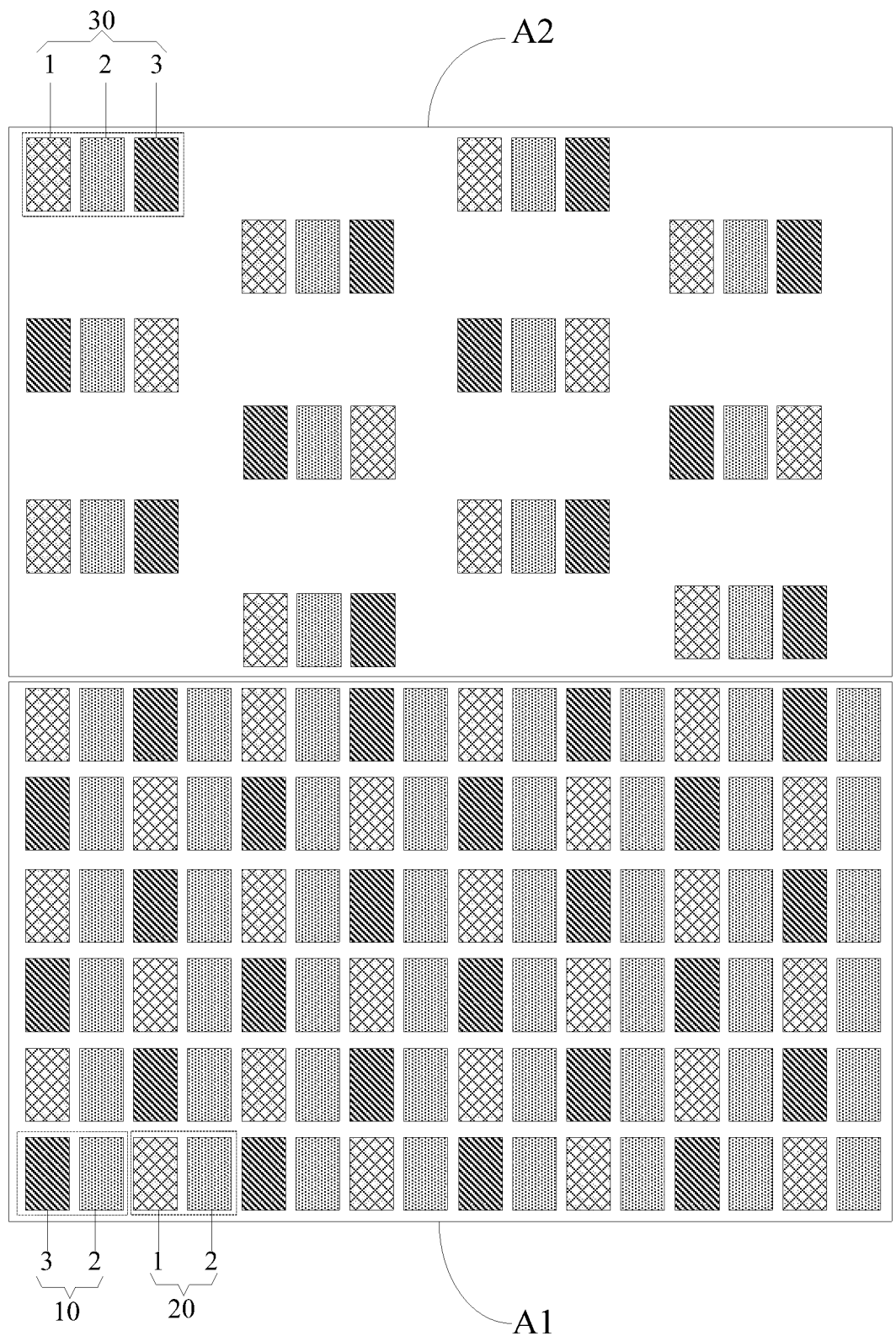
FIG. 6 is a fifth schematic structural diagram of a part of the display substrate according to an embodiment of this disclosure.

Optionally in the display substrate according to an embodiment of this disclosure, a plurality of third pixel elements 30 are arranged in a tessellated pattern in the second display sub-area A2 as illustrated in FIG. 6, and FIG. 11 to FIG. 13, that is, the third pixel elements 30 are arranged in every other column in the row direction, and in every other row in the column direction. As illustrated in FIG. 6, for example, the third pixel elements 30 in the odd rows are arranged in the odd columns, and the third pixel elements 30 in the even rows are arranged in the even rows, so that the third pixel elements 30 are distributed uniformly in both the row direction and the column direction, thus resulting in uniform brightness in the second display sub-area A2. For example, alternatively the third pixel elements 30 in the odd rows can be arranged in the even columns, and the third pixel elements 30 in the even rows can be arranged in the odd columns, so that any two third pixel elements are spaced from each other by a specific spacing, where for example, the spacing can be the length of at least one third pixel element in the row direction, and the length of at least one third pixel element in the column direction, although an embodiment of this disclosure will not be limited thereto.

Figure 5:
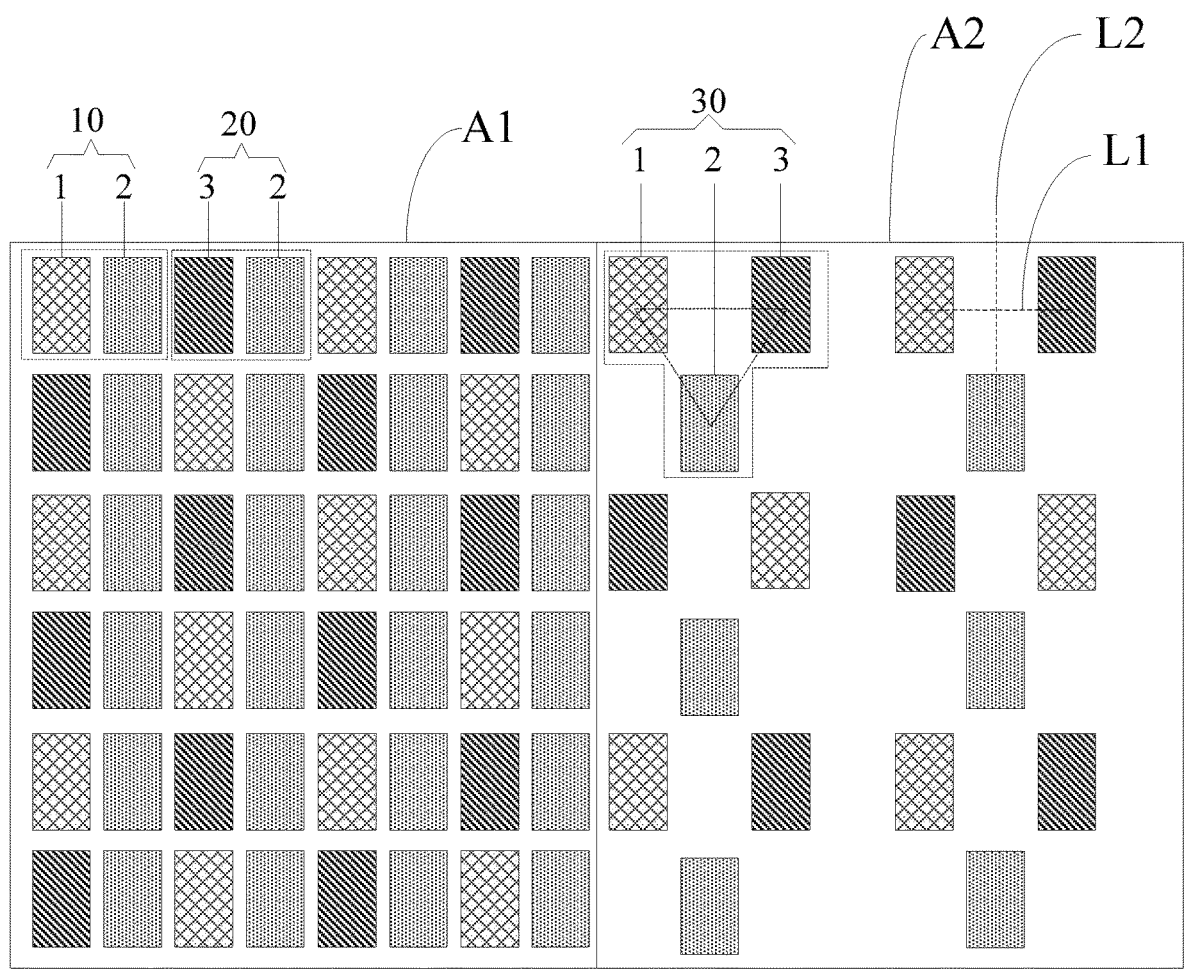
FIG. 5 is a fourth schematic structural diagram of a part of the display substrate according to an embodiment of this disclosure.
Figure 10:
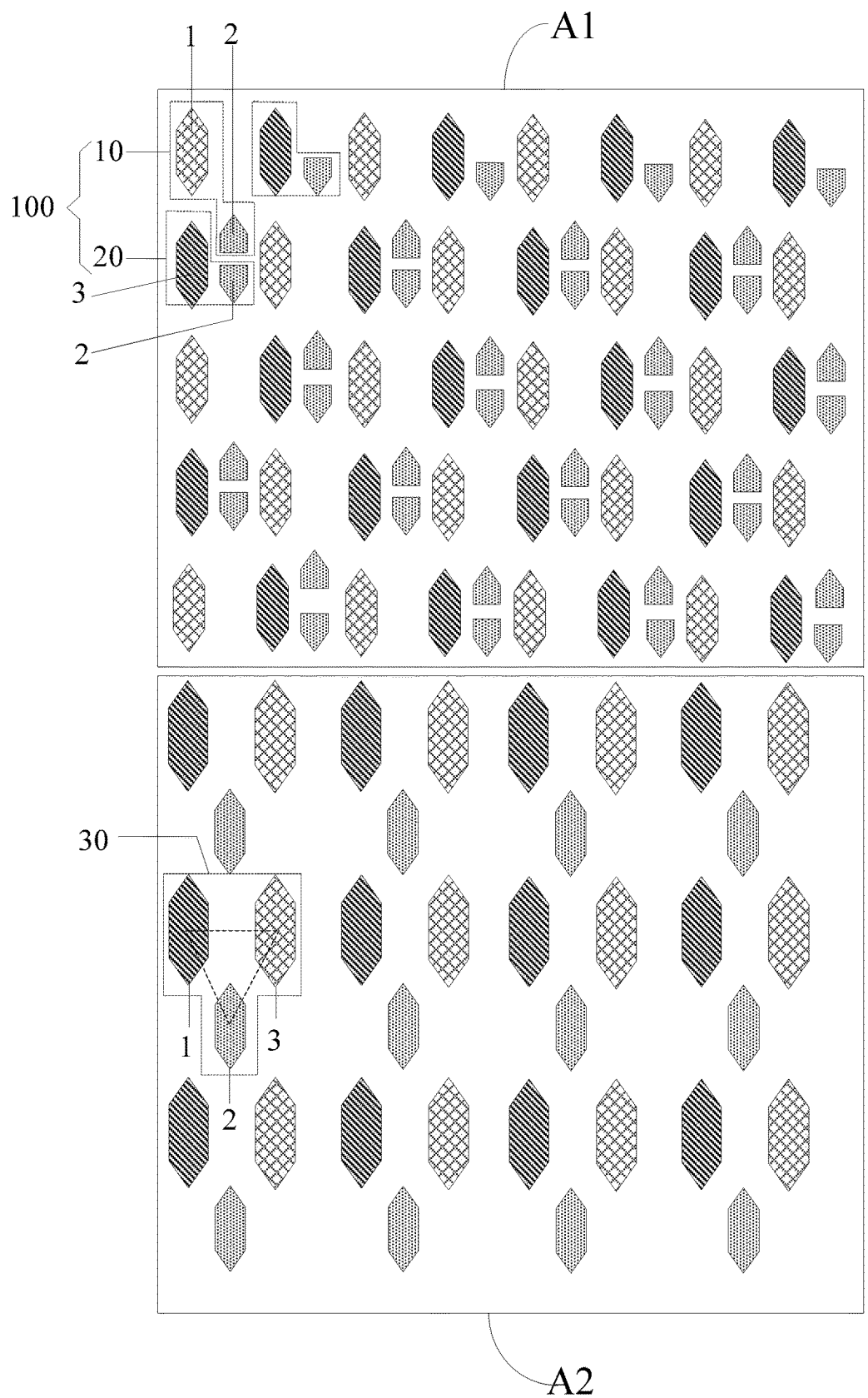
FIG. 10 is a ninth schematic structural diagram of a part of the display substrate according to an embodiment of this disclosure.
Figure 11:
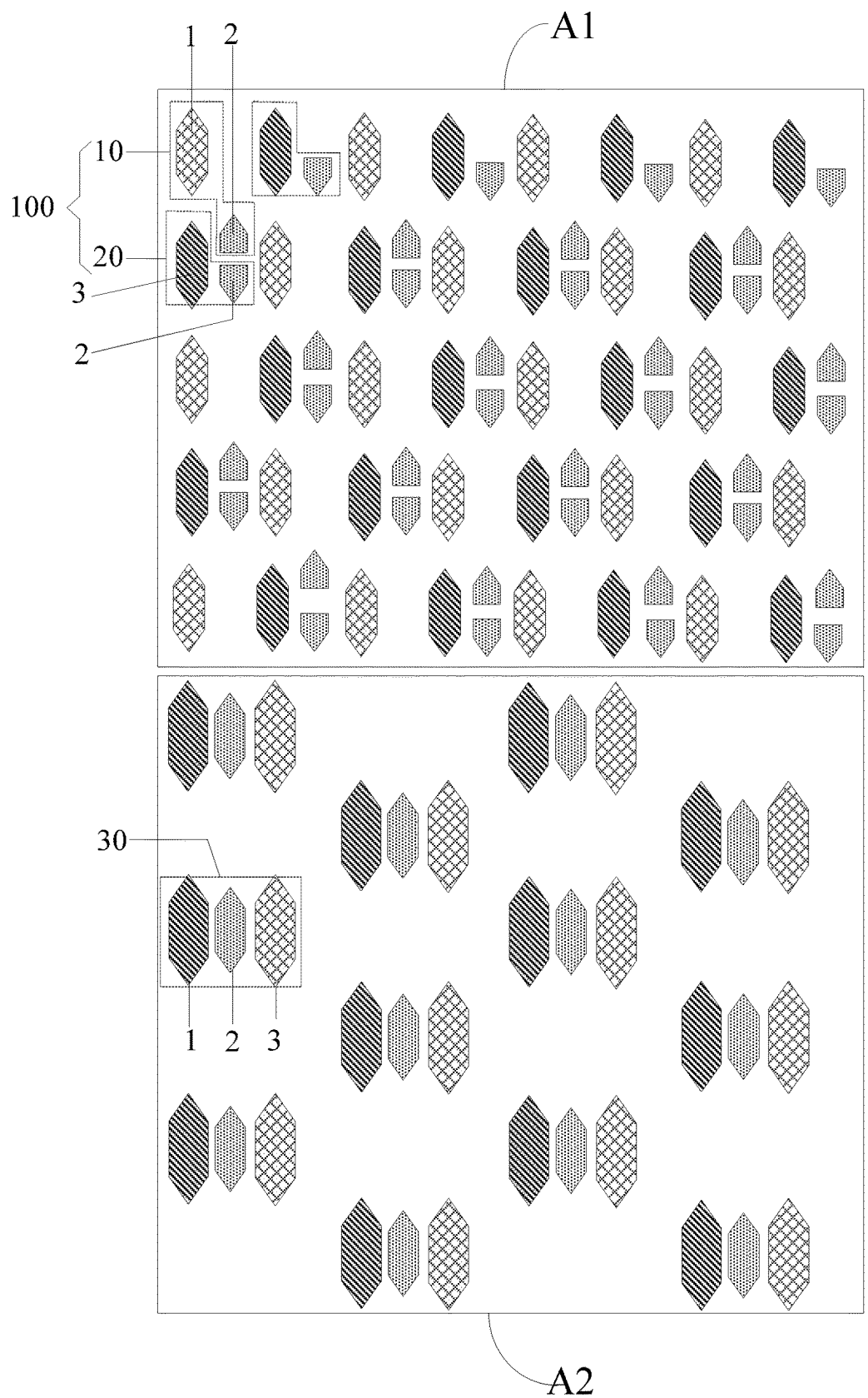
FIG. 11 is a tenth schematic structural diagram of a part of the display substrate according to an embodiment of this disclosure.

Optionally in the display substrate according to an embodiment of this disclosure, as illustrated in FIG. 5 and FIG. 10, in each third pixel element 30 in the second display sub-area A2, the first sub-pixel 1 and the third sub-pixel 3 are arranged in the same row, and the second sub-pixel 2 is located in an adjacent row to the row in which the first sub-pixel 1 and the third sub-pixel 3 are located. For example, the first sub-pixel 1 and the third sub-pixel 3 in the same third pixel element 30 are located in the first row, and the second sub-pixel 2 is located in the second row, so that lines connecting the centers of the first sub-pixel, the second sub-pixel, and the third sub-pixel in the same third pixel element 30 constitute a triangle to thereby avoid traverse bright and dark strips from occurring in the second display sub-area.

It shall be noted that in the display substrate according to an embodiment of this disclosure, the center of a sub-pixel refers to the center of a light-emitting area of the sub-pixel. Taking an OLED display panel as an example, a sub-pixel generally includes an anode layer, a light-emitting layer, and a cathode layer structured in a stack, where in order to display an image, the light-emitting area corresponding to the stack structure is a light-emitting area of the sub-pixel, so that the area occupied by the light-emitting area is a light-emitting area. Of course, the light-emitting area can alternatively be an area occupied by an opening area defined by the pixel definition layer, for example, although an embodiment of this disclosure will not be limited thereto.

Optionally in the display substrate according to an embodiment of this disclosure, as illustrated in FIG. 5 and FIG. 10, in the same third pixel element 30, an orthographical projection of the center of the second sub-pixel 2 onto the line L1 connecting the center of the first sub-pixel 1 with the center of the third sub-pixel 3 lies between the center of the first sub-pixel 1, and the center of the third sub-pixel 3. For example, the orthographical projection of the center of the second sub-pixel 2 onto the line L1 connecting the center of the first sub-pixel 1 with the center of the third sub-pixel 3 lies onto the intersection between the connecting line L1 and the straight line L2. In this way, the distance between the center of the second sub-pixel 2, and the center of the first sub-pixel 1 in the third pixel element 30 can be equal to the distance between the center of the second sub-pixel 2, and the center of the third sub-pixel 3 so that these three sub-pixels are arranged in an isoceles triangle pattern to thereby avoid vertical bright and dark strips from occurring in the second display sub-area A2.

In a particular implementation, the distance between the center of the second sub-pixel 2, and the center of the first sub-pixel 1 may not be exactly equal to the distance between the center of the second sub-pixel 2, and the center of the third sub-pixel 3, and there may be some error due to a limiting process condition or another factor, e.g., an arrangement of wires or through-holes, in a real process, so the shapes and the positions of the respective sub-pixels, and their relative positional relationship can substantially satisfy the condition above without departing from the scope of this disclosure.

Optionally in the display substrate according to an embodiment of this disclosure, as illustrated in FIG. 2 to FIG. 4, FIG. 6 to FIG. 9, and FIG. 11 to FIG. 13, the first sub-pixel 1, the second sub-pixel 2, and the third sub-pixel 3 in the third pixel element 30 are arranged in the same row or column in the second display sub-area A2, although an embodiment of this disclosure will not be limited thereto.

Of course, in a particular implementation, in the display substrate according to an embodiment of this disclosure, as illustrated in FIG. 2 to FIG. 4, FIG. 6 to FIG. 9, and FIG. 11 to FIG. 13, the first sub-pixel 1, the second sub-pixel 2, and the third sub-pixel 3 in the third pixel element 30 are arranged successively in the same row or column in the second display sub-area A2, although an embodiment of this disclosure will not be limited thereto. Furthermore, of course, in a particular implementation, in the display substrate according to an embodiment of this disclosure, as illustrated in FIG. 2 to FIG. 4, FIG. 6 to FIG. 9, and FIG. 11 to FIG. 13, the first sub-pixel 1, the second sub-pixel 2, and the third sub-pixel 3 in the third pixel element 30 are arranged adjacent to each other in order in the same row or column in the second display sub-area A2, although an embodiment of this disclosure will not be limited thereto.

Optionally in the display substrate according to an embodiment of this disclosure, as illustrated in FIG. 2, FIG. 4 to FIG. 6, and FIG. 12, in the second display sub-area A2, the sub-pixels in two third pixel elements 30 adjacent in the row direction are arranged in the same order in the row direction, and the sub-pixels in two third pixel elements 30 adjacent in the column direction are arranged in opposite orders in the row direction, so that the first sub-pixels 1 and the third sub-pixels 3 can be arranged alternately in the column direction in the second display sub-area A2 to thereby avoid a color crosstalk from occurring in the column direction. As illustrated in FIG. 2, for example, taking the first row of third pixel elements 30 as an example, the first sub-pixel 1, the second sub-pixel 2, and the third sub-pixel 3 in each of two adjacent third pixel elements 30 are arranged successively from the left to the right in the row direction. Taking the first column of third pixel elements 30 as an example, in the column direction, the first sub-pixel 1, the second sub-pixel 2, and the third sub-pixel 3 in each third pixel element 30 in an odd row are arranged successively from the left to the right, and the first sub-pixel 1, the second sub-pixel 2, and the third sub-pixel 3 in each third pixel element 30 in an even row are arranged successively from the left to the right. As illustrated in FIG. 5, for example, taking the first row of third pixel elements 30 as an example, the first sub-pixel 1, the second sub-pixel 2, and the third sub-pixel 3 in each of two adjacent third pixel elements 30 are arranged in an upside-down triangle pattern in the row direction. Taking the first column of third pixel elements 30 as an example, in the column direction, the first sub-pixel 1, the second sub-pixel 2, and the third sub-pixel 3 in each third pixel element 30 in an odd row are arranged in an upside-down triangle patter, and the first sub-pixel 1, the second sub-pixel 2, and the third sub-pixel 3 in each third pixel element 30 in an even row are arranged in an upside-down triangle patter.

In a particular implementation, in the display substrate according to an embodiment of this disclosure, the sub-pixels in each third pixel element in the second display sub-area A2 can be arranged in the same order as illustrated in FIG. 2, and FIG. 7 to FIG. 11.

Figure 13:
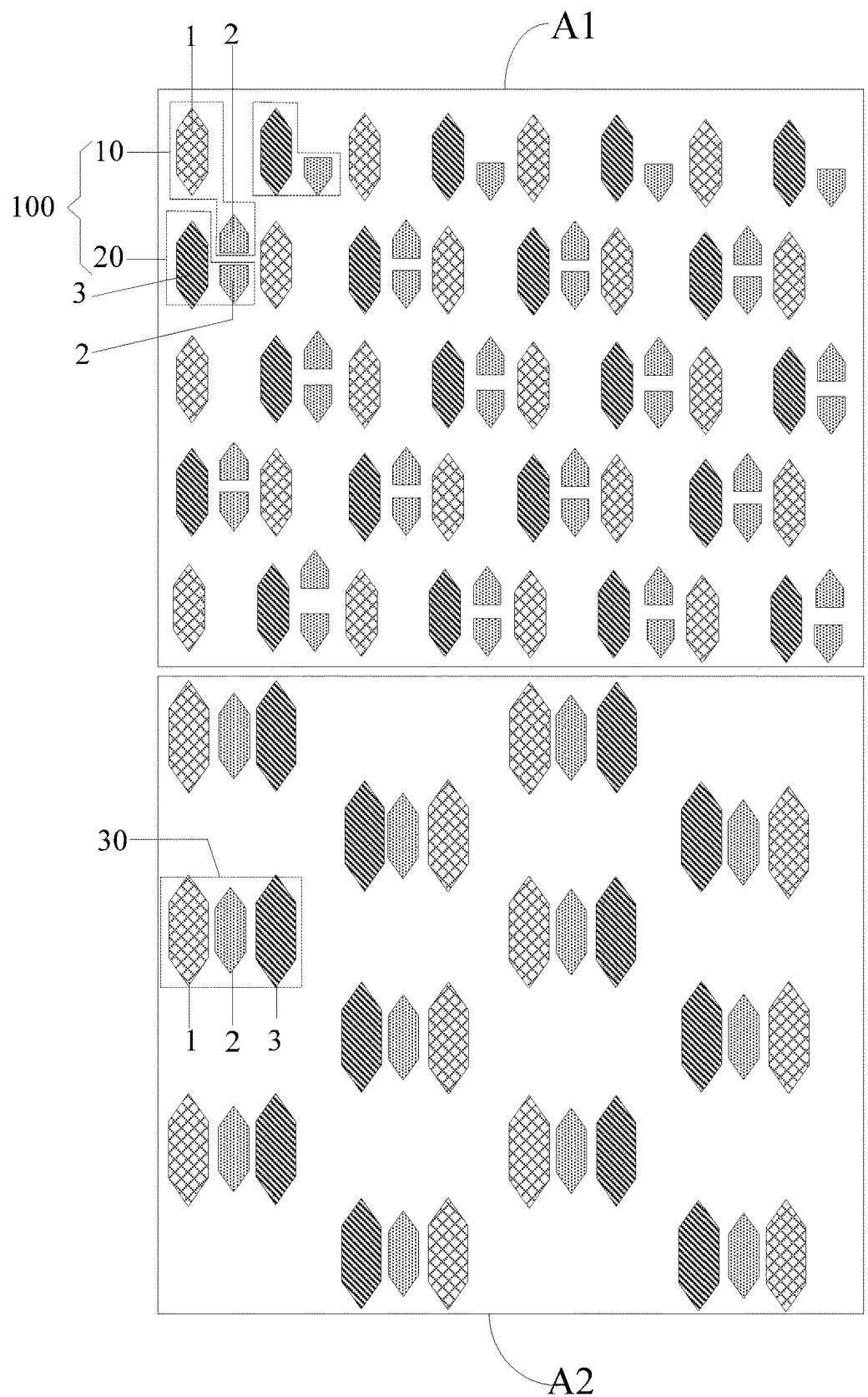
FIG. 13 is a twelfth schematic structural diagram of a part of the display substrate according to an embodiment of this disclosure.

In a particular implementation, in the display substrate according to an embodiment of this disclosure, the sub-pixels in each third pixel element 30 in the same column are arranged in the same order, and the sub-pixels in the third pixel elements 30 in two adjacent columns are arranged in opposite orders, in the second display sub-area A2 as illustrated in FIG. 13. For example, the first sub-pixel 1, the second sub-pixel 2, and the third sub-pixel 3 in each third pixel element 30 in an odd column are arranged successively from the left to the right, and the second sub-pixel 2, and the third sub-pixel 3 in each third pixel element 30 in an even column are arranged successively from the left to the right.

In a particular implementation, in the display substrate according to an embodiment of this disclosure, the shapes of the first sub-pixels 1, the second sub-pixels 2, and the third sub-pixels 3 are substantially the same in the second display sub-area A2 as illustrated in FIG. 2 to FIG. 6, and FIG. 8 to FIG. 13.

In a particular implementation, in the display substrate according to an embodiment of this disclosure, a light-emitting area of a second sub-pixel is smaller than or substantially equal to a light-emitting area of a first sub-pixel, and a light-emitting area of a second sub-pixel is smaller than or substantially equal to a light-emitting area of a third sub-pixel, in the second display sub-area. As illustrated in FIG. 2 to FIG. 6, for example, a light-emitting area of a second sub-pixel 2 is substantially equal to a light-emitting area of a first sub-pixel 1, and a light-emitting area of a second sub-pixel 2 is substantially equal to a light-emitting area of a third sub-pixel 3, in the second display sub-area A2. As illustrated in FIG. 7 to FIG. 13, a light-emitting area of a second sub-pixel 2 is smaller than to a light-emitting area of a first sub-pixel 1, and a light-emitting area of a second sub-pixel 2 is smaller than or substantially equal to a light-emitting area of a third sub-pixel 3, in the second display sub-area. Of course, the relationship between a light-emitting area of a second sub-pixel, a light-emitting area of a first sub-pixel, and a light-emitting area of a third sub-pixel in the second display sub-area can be determined according to a real application, although an embodiment of this disclosure will not be limited thereto.

In a particular implementation, in the display substrate according to an embodiment of this disclosure, as illustrated in FIG. 2 to FIG. 13, a light-emitting area of a first sub-pixel 1 is substantially equal to a light-emitting area of a third sub-pixel 3 in the second display sub-area A2.

Optionally in the display substrate according to an embodiment of this disclosure, as illustrated in FIG. 2 to FIG. 13, the first pixel elements 10 and the second pixel elements 20 in the first display sub-area A1 can be arranged in any pan tile pattern, although an embodiment of this disclosure will not be limited thereto.

Optionally in the display substrate according to an embodiment of this disclosure, as illustrated in FIG. 2 to FIG. 13, the first pixel elements 10 and the second pixel elements 20 are arranged alternately in the column direction, and the first pixel elements 10 and the second pixel elements 20 are arranged alternately in the row direction, in the first display sub-area A1.

Optionally in the display substrate according to an embodiment of this disclosure, as illustrated in FIG. 2 to FIG. 6, the second sub-pixel 2 and the first sub-pixel 1 in each first pixel element 10 are arranged in the same row, and the second sub-pixel 2 and the third sub-pixel 3 in each second pixel element 20 are arranged in the same row, in the first display sub-area A1; and for the first pixel element 10 and the second pixel element 20 adjacent in the row direction, the second sub-pixel 2 in the first pixel element 10 is not immediately adjacent to the second sub-pixel 2 in the second pixel element 20. For example, for the first pixel element 10 and the second pixel element 20 adjacent in the row direction, the second sub-pixel 2 in the first pixel element 10 is spaced from the second sub-pixel 2 in the second pixel element 20 by the third sub-pixel 3. Of course, there may be alternative implementations to the implementation above, and a repeated description thereof will be omitted here.

Furthermore in the display substrate according to an embodiment of this disclosure, as illustrated in FIG. 2 to FIG. 6, a light-emitting area of a first sub-pixel 1, a light-emitting area of a second sub-pixel 2, and a light-emitting area of a third sub-pixel 3 can be substantially the same in the first display sub-area A2.

Optionally in the display substrate according to an embodiment of this disclosure, as illustrated in FIG. 7 to FIG. 13, the second sub-pixel 2 and the first sub-pixel 1 in each first pixel element 10 are staggered in rows and columns, and the second sub-pixel 2 and the third sub-pixel 3 in each second pixel element 20 are arranged in the same row, in the first display sub-area A1; and the first pixel element 10 and the second pixel element 20 adjacent in the column direction are a group of pixels 100, and in the same group of pixels 100, the second sub-pixel 2 in the first pixel element 10, and the third sub-pixel 3 in the second pixel element 20 are arranged in the same row, and the second sub-pixel 2 in the first pixel element 10, and the second sub-pixel 2 in the second pixel element 20 are located in the same column.

Furthermore in the display substrate according to an embodiment of this disclosure, as illustrated in FIG. 7 to FIG. 12, two second sub-pixels 2 in the same group of pixels 100 are arranged adjacent to each other in the column direction, and the two second sub-pixels 2 are symmetric in the row direction even if they are arranged in a mirror pattern. Furthermore, in the first display sub-area A1, when the second sub-pixels 2 are green sub-pixels, the total light-emitting area of two second sub-pixels 2 is smaller than a light-emitting area of a first sub-pixel 1, and the total light-emitting area of two second sub-pixels 2 is smaller than a light-emitting area of a third sub-pixel 3, because the green sub-pixels have higher light-emission efficiency than that of the sub-pixels in the other colors.

Optionally in the display substrate according to an embodiment of this disclosure, as illustrated in FIG. 2 to FIG. 13, the sub-pixels in each first pixel element 10 are arranged in the same order, and the sub-pixels in each second pixel element 20 are arranged in the same order, in the first display sub-area. As illustrated in FIG. 2 to FIG. 6, for example, the first sub-pixel 1 and the second sub-pixel 2 in each first pixel element 10 are arranged successively from the left to the right, and the third sub-pixel 3 and the second sub-pixel 2 in each second pixel element 20 are arranged successively from the left to the right. As illustrated in FIG. 7 to FIG. 13, the second sub-pixel 2 and the third sub-pixel 3 in each second pixel element 20 are arranged successively from the left to the right, and the first sub-pixel 1 and the second sub-pixel 2 in each first pixel element 10 are arranged successively from the top left to the bottom right.

Optionally in the display substrate according to an embodiment of this disclosure, a light-emitting area of a second sub-pixel is not larger than a light-emitting area of a first sub-pixel, and a light-emitting area of a second sub-pixel is not larger than a light-emitting area of a third sub-pixel, in the first display sub-area. As illustrated in FIG. 2 to FIG. 6, for example, a light-emitting area of a second sub-pixel 2 is substantially equal to a light-emitting area of a first sub-pixel 1, and a light-emitting area of a second sub-pixel 2 is substantially equal to a light-emitting area of a third sub-pixel 3, in the first display sub-area A1. As illustrated in FIG. 7 to FIG. 13, a light-emitting area of a second sub-pixel 2 is smaller than a light-emitting area of a first sub-pixel 1, and a light-emitting area of a second sub-pixel 2 is smaller than a light-emitting area of a third sub-pixel 3, in the first display sub-area A1. Since the number of first sub-pixels 1 is the same as the number of third sub-pixels 3, and the number of second sub-pixels 2 is twice the number of first sub-pixels 1, in the first display sub-area A1, the light-emitting area of each second sub-pixel 2 can be made smaller.

Optionally in the display substrate according to an embodiment of this disclosure, a light-emitting area of a first sub-pixel 1 is substantially equal to a light-emitting area of a third sub-pixel 3 in the first display sub-area A1 as illustrated in FIG. 2 to FIG. 13.

In the display substrate according to an embodiment of this disclosure, the shapes of the first sub-pixels, the second sub-pixels, and the third sub-pixels in the first display sub-area will not be limited to any particular shapes, and may be regular or irregular shapes. In a particular implementation, a regular shape is generally easy to form from the perspective of a process.

In the display substrate according to an embodiment of this disclosure, the shapes of the first sub-pixels, the second sub-pixels, and the third sub-pixels in the second display sub-area will not be limited to any particular shapes, and may be regular or irregular shapes. In a particular implementation, a regular shape is generally easy to form from the perspective of a process.

Optionally in the display substrate according to an embodiment of this disclosure, as illustrated in FIG. 7 to FIG. 12, the shapes of the first sub-pixel 1 and the third sub-pixel 3 are the same, and the shape of a combination of two second sub-pixels 2 is the same as the shape of the first sub-pixel 1 or the third sub-pixel 3, in the same group of pixels 100.

Optionally in the display substrate according to an embodiment of this disclosure, the shape of a first sub-pixel is at least one of a rectangle and a hexagon. As illustrated in FIG. 2 to FIG. 6, for example, the shape of a first sub-pixel 1 in each of the first display sub-area A1 and the second display sub-area A2 is rectangular. As illustrated in FIG. 7 to FIG. 12, the shape of a first sub-pixel 1 in each of the first display sub-area A1 and the second display sub-area A2 is hexagonal. Of course, the shape of a first sub-pixel can alternatively be a rounded shape, elliptic, etc., although an embodiment of this disclosure will not be limited thereto.

Optionally in the display substrate according to an embodiment of this disclosure, as illustrated in FIG. 7 to FIG. 12, both of the shapes of the first sub-pixels 1 and the third sub-pixels 3 are hexagonal, and the shape of a combination of two sub-pixels 2 is hexagonal, in the first display sub-area A1.

Optionally in the display substrate according to an embodiment of this disclosure, the shape of at least one of a first sub-pixel and a third sub-pixel in the second display sub-area is substantially the same as the shape of a first sub-pixel in the first display sub-area. As illustrated in FIG. 2 to FIG. 13, for example, the shape of a first sub-pixel 1 in the second display sub-area A2 is substantially the same as the shape of a first sub-pixel 1 in the first display sub-area A1. As illustrated in FIG. 2 to FIG. 13, the shape of a third sub-pixel 3 in the second display sub-area A2 is substantially the same as the shape of a first sub-pixel 1 in the first display sub-area A1. As illustrated in FIG. 2 to FIG. 13, the shape of a first sub-pixel 1, and the shape of a third sub-pixel 3 respectively in the second display sub-area A2 are substantially the same as the shape of a first sub-pixel 1 in the first display sub-area A1.

Figure 7:
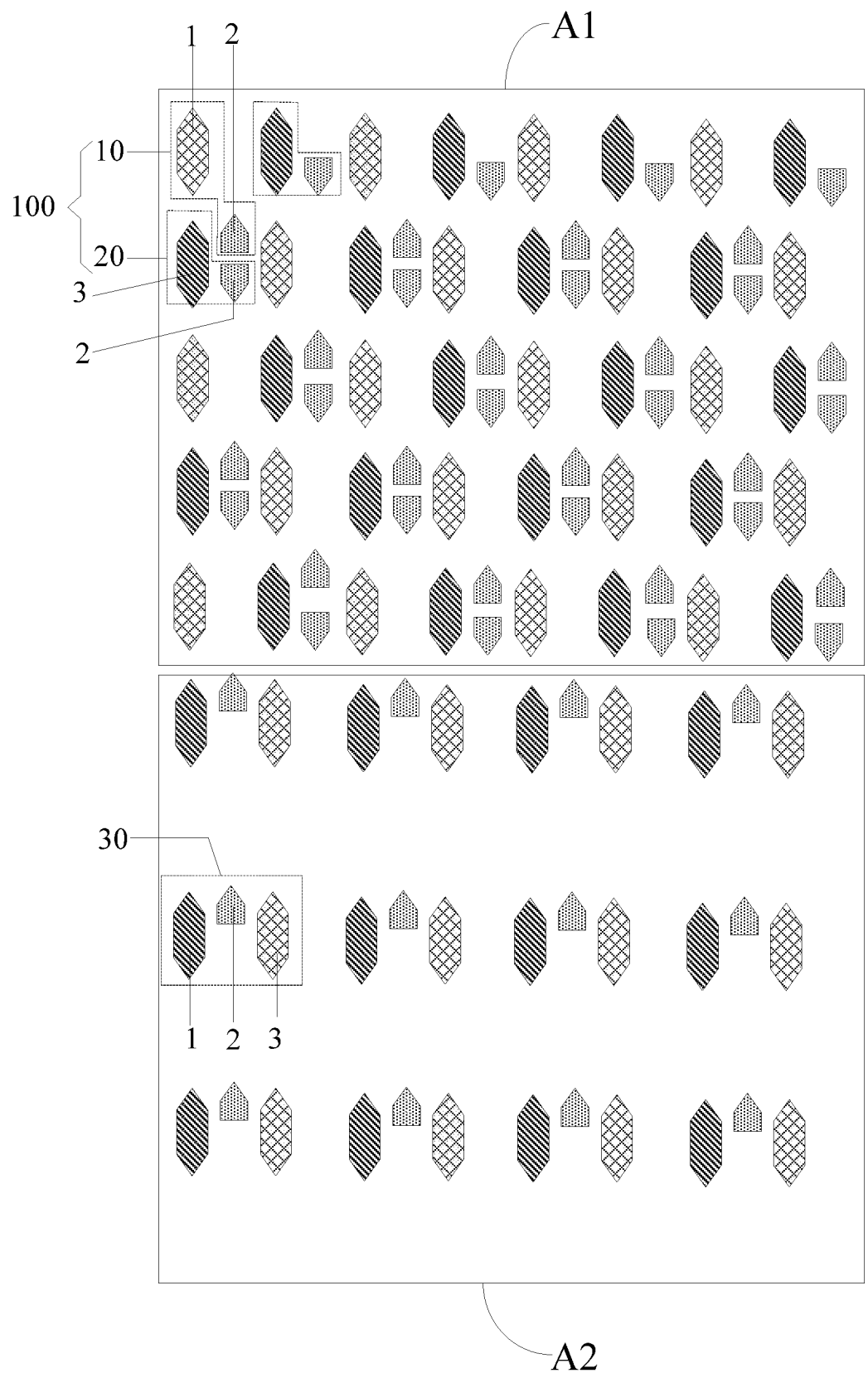
FIG. 7 is a sixth schematic structural diagram of a part of the display substrate according to an embodiment of this disclosure.
Figure 8:
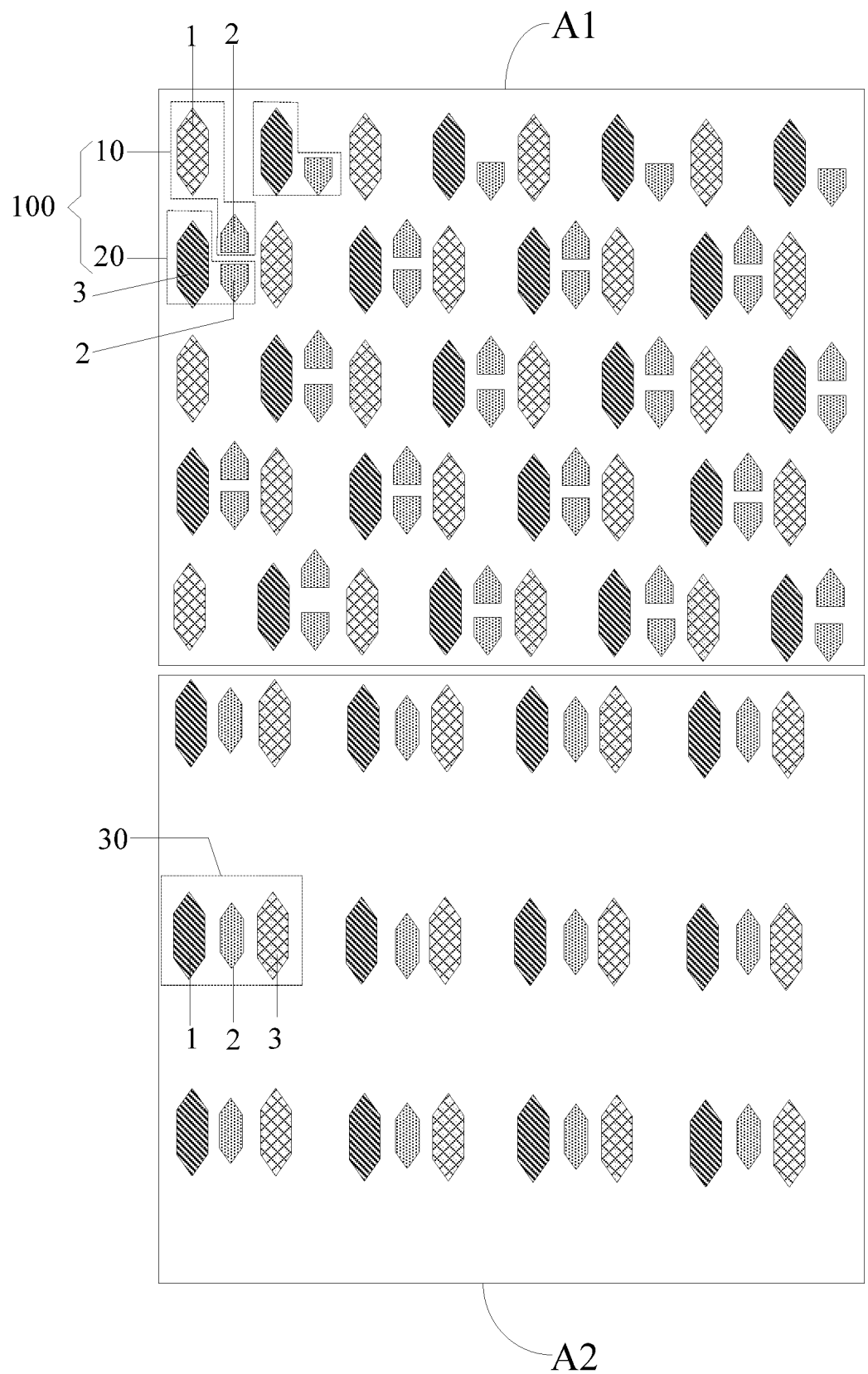
FIG. 8 is a seventh schematic structural diagram of a part of the display substrate according to an embodiment of this disclosure.
Figure 9:
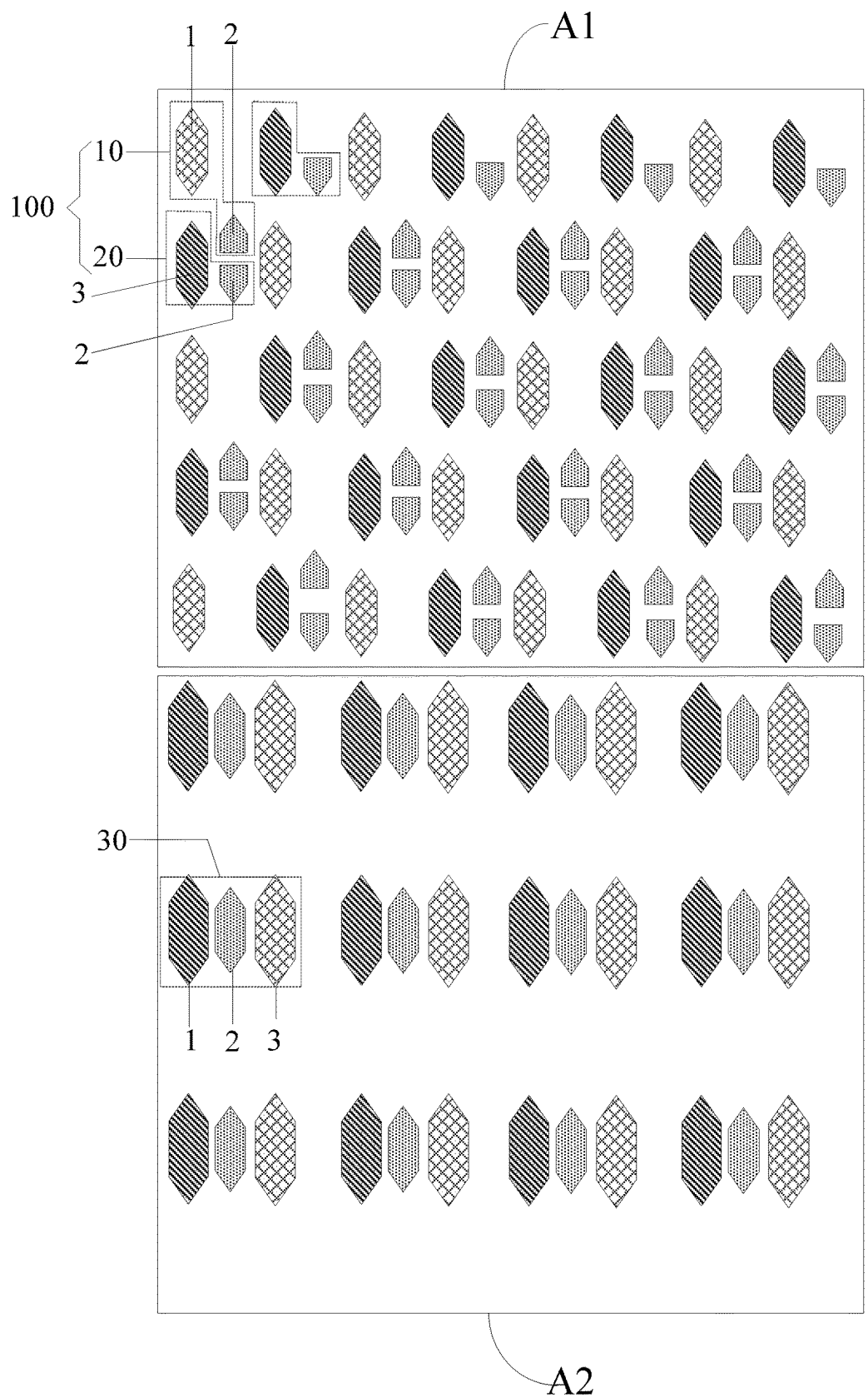
FIG. 9 is an eighth schematic structural diagram of a part of the display substrate according to an embodiment of this disclosure.

Optionally in the display substrate according to an embodiment of this disclosure, the shape of one of a first sub-pixel and a second sub-pixel in the first display sub-area is substantially the same as the shape of a second sub-pixel in the second display sub-area. As illustrated in FIG. 2 to FIG. 6, and FIG. 8 to FIG. 13, for example, the shape of a first sub-pixel 1 in the first display sub-area A1 is substantially the same as the shape of a second sub-pixel 2 in the second display sub-area A2. As illustrated in FIG. 7, the shape of a second sub-pixel 2 in the first display sub-area A1 is substantially the same as the shape of a second sub-pixel 2 in the second display sub-area A2.

It shall be noted the shapes of the respective first sub-pixels 1, the respective second sub-pixels 2, and the respective third sub-pixels 3 in the same sub-area are substantially the same, and although there is substantially the same shape of these three kinds of sub-pixels, there may be different light-emitting areas thereof. As illustrated in FIG. 10, for example, a light-emitting area of a second sub-pixel 2 is smaller than a light-emitting area of a first sub-pixel 1, and a light-emitting area of a second sub-pixel 2 is smaller than a light-emitting area of a third sub-pixel 3, in the second display sub-area A2. In a real application, for example, they can be arranged in an implementation in which a light-emitting area of a blue sub-pixel is larger than a light-emitting area of a red sub-pixel, which is larger than a light-emitting area of a green sub-pixel, or a light-emitting area of a blue sub-pixel is larger than a light-emitting area of a green sub-pixel, which is larger than a light-emitting area of a red sub-pixel, although an embodiment of this disclosure will not be limited thereto.

It shall be noted that in the display substrate according to an embodiment of this disclosure, the shape of a sub-pixel refers to the shape of a light-emitting area of the sub-pixel.

Optionally in the display substrate according to an embodiment of this disclosure, as illustrated in FIG. 7 to FIG. 12, when the second sub-pixels 2 in the first display sub-area A1 are green sub-pixels, the total light-emitting area of two second sub-pixels 2 is smaller than the area of a first sub-pixel 1, and the total light-emitting area of two second sub-pixels 2 is smaller than the area of a third sub-pixel 3, because the green sub-pixels have higher light-emission efficiency than that of the sub-pixels in the other colors.

Optionally in the display substrate according to an embodiment of this disclosure, as illustrated in FIG. 7 to FIG. 12, when the second sub-pixels 2 in the second display sub-area A2 are green sub-pixels, a light-emitting area of a second sub-pixel 2 is smaller than a light-emitting area of a first sub-pixel 1, and a light-emitting area of a second sub-pixel is smaller than a light-emitting area of a third sub-pixel 3.

Figure 15:
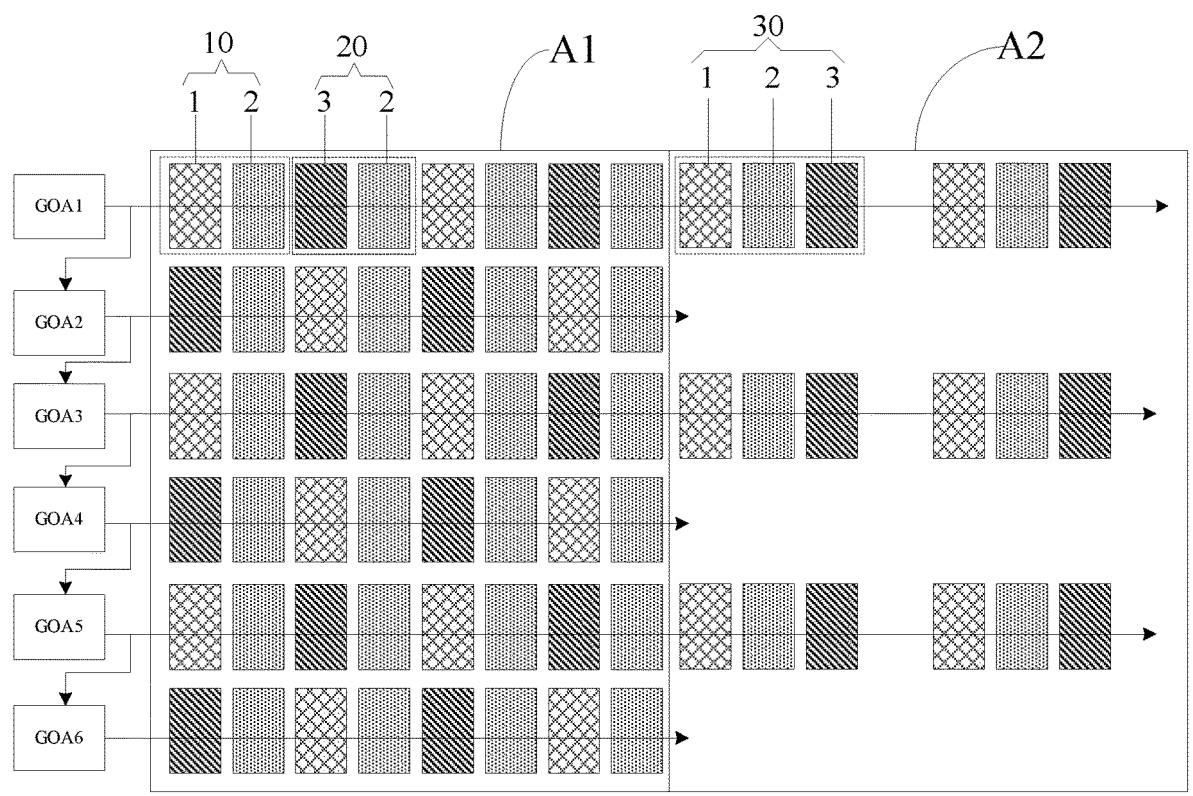
FIG. 15 is a demo diagram of the display substrate according to an embodiment of this disclosure, which is being scanned.

In a particular implementation, in the display substrate according to an embodiment of this disclosure, the display substrate according to an embodiment of this disclosure generally displays an image by scanning the first display sub-area row by row. As illustrated in FIG. 15, for example, when the first display sub-area A1 and the second display sub-area A2 are adjacent to each other in the row direction, gate driver circuits GOA1 to GOA5 output signals row by row, but only the GOA1, the GOA3, and the GOA5 output signals for the second display sub-area A2.

Figure 14:
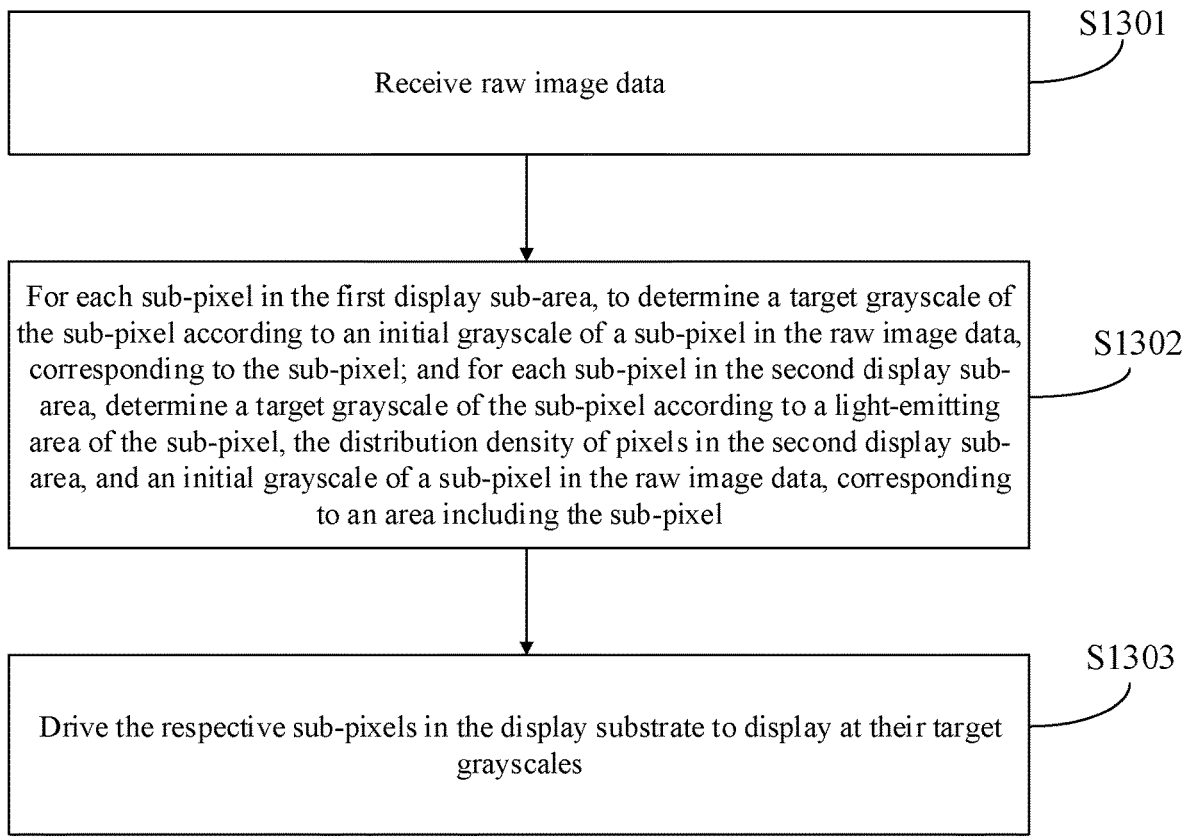
FIG. 14 is a schematic flow chart of a method for driving the display substrate according to an embodiment of this disclosure.

Based upon the same inventive idea, an embodiment of this disclosure further provides a method for driving the display substrate according to any one of an embodiments above of this disclosure, and as illustrated in FIG. 14, the method includes the following steps:

the step S1301 is to receive raw image data;

the step S1302 is, for each sub-pixel in the first display sub-area, to determine a target grayscale of the sub-pixel according to an initial grayscale of a sub-pixel in the raw image data, corresponding to the sub-pixel; and for each sub-pixel in the second display sub-area, to determine a target grayscale of the sub-pixel according to a light-emitting area of the sub-pixel, the distribution density of pixels in the second display sub-area, and an initial grayscale of a sub-pixel in the raw image data, corresponding to an area including the sub-pixel; and the step S1303 is to drive the respective sub-pixels in the display substrate to display at their target grayscales.

For a sub-pixel in the first display sub-area, when a physical pixel in the first display sub-area corresponds to a pixel in the image data, a target grayscale of the sub-pixel is generally an initial grayscale thereof; and when the number of physical pixels in the first display sub-area is less than the number of pixels in the image data, there is a borrowing relationship between displaying sub-pixels, so a sub-pixel may correspond to two or more pixels in the image data, and thus the garget grayscale of the sub-pixel shall be calculated according to the initial grayscale of the sub-pixel in the raw image data, corresponding thereto.

For each sub-pixel in the second display sub-area, there is a low resolution, and in order to display an image, a physical pixel corresponds to a pixel in the image data, and a target grayscale of the sub-pixel is generally an initial grayscale thereof. However there may be such a problem there is a low resolution of the second display sub-area, and if the image is displayed directly at the initial grayscale, then there will be such a large difference in brightness between the second display sub-area and the first display sub-area that there may be an apparent dark strip at the interface between the second display sub-area and the first display sub-area. In order to address this problem, a driver according to this embodiment of this disclosure adjusts the grayscale of the sub-pixel in the second display sub-area according to a light-emitting area of the sub-pixel, and the distribution density of pixels in the second display sub-area. For example, if there is a larger light-emitting area of the sub-pixel, there is high overall brightness in the second display sub-area, and there are a larger number of sub-pixels distributed in the second display sub-area, then there will be high overall brightness in the second display sub-area.

It shall be noted that a physical pixel generally includes three RGB sub-pixels.

In a particular implementation, when the pixels are arranged in a pan tile pattern in the first display sub-area, both the first sub-pixels and the third sub-pixels are borrowed for displaying an image, so a first sub-pixel generally corresponds to two pixels in the image data, a third sub-pixel corresponds to two pixels in the image data, and no second sub-pixel is borrowed, and thus a second sub-pixel generally corresponds to a pixel in the image data.

Accordingly optionally in the method according to an embodiment of this disclosure, determining for each sub-pixel in the first display sub-area the target grayscale of the sub-pixel particularly can include:

determining a target grayscale X corresponding to a first sub-pixel in the equation of $$X = \left( \frac{x_1^{Gamma} + x_2^{Gamma}}{2} \right)^{\frac{1}{Gamma}},$$

where Gamma represents a gamma value of the display substrate, and $x_1$ and $x_2$ represent initial grayscales of two first sub-pixels in the raw image data, which correspond to the first sub-pixel respectively;

determining a target grayscale Y of a second sub-pixel as an initial grayscale y of a second sub-pixel in the raw image data, corresponding to the second sub-pixel; and determining a target grayscale Z corresponding to a third sub-pixel in the equation of $$Z = \left( \frac{z_1^{Gamma} + z_2^{Gamma}}{2} \right)^{\frac{1}{Gamma}},$$

where $z_2$ represent initial grayscales of two third sub-pixels in the raw image data, which correspond to the third sub-pixel respectively.

In a particular implementation, in order to alleviate a dark strip at the interface between the second display sub-area and the first display sub-area, brightness in the second display sub-area can be adjusted as appropriate, where the brightness is in proportion to a light-emitting area and the distribution density of pixels.

Accordingly optionally in the method according to an embodiment of this disclosure, determining for each sub-pixel in the second display sub-area the target grayscale of the sub-pixel particularly can include:

determining the target grayscale X corresponding to the sub-pixel in the equation of $$X = k*s*\rho \left( \frac{x_1^{Gamma} + x_2^{Gamma} + \ldots + x_n^{Gamma}}{n} \right)^{\frac{1}{Gamma}},$$

where n is any integer ranging from 1 to N, N is the number of sub-pixels in the raw image data, which correspond to the sub-pixel, Gamma represents a gamma value of the display substrate, s represents the ratio of a light-emitting area of a sub-pixel in the first display sub-area to a light-emitting area of a sub-pixel in the second display sub-area, $\rho$ represents the ratio of the distribution density of pixels in the first display sub-area to the distribution density of pixels in the second display sub-area, k is an error adjustment coefficient, and $x_n$ is an initial grayscale of the n-th sub-pixel in the raw image data, corresponding to the sub-pixel.

In a particular implementation, the error adjustment coefficient k can be adjusted according to a real display effect of the display substrate, although an embodiment of this disclosure will not be limited thereto.

In a particular implementation, if there are m third pixel elements in a unit of area in the second display sub-area, and there are j pixels in the image data in the corresponding area, then there will be j/m pixels in image data corresponding to a third pixel element, that is, N=j/m. A target grayscale of a sub-pixel can be determined according to any one or more of N sub-pixels corresponding thereto. For example, with N=4, a target grayscale of a sub-pixel can be determined according to initial grayscales of any one or more of four sub-pixels in image data corresponding thereto. For example, if it is determined according to an initial grayscale of one of the sub-pixels, then $X=k*s*\rho*x_1$, where $x_1$ represents an initial grayscale of any one of the four sub-pixels. For example, if it is determined according to initial grayscales of two of the sub-pixels, then $$X = k*s*\rho \left( \frac{x_1^{Gamma} + x_2^{Gamma}}{2} \right)^{\frac{1}{Gamma}},$$

where $x_1$ and $x_2$ represent initial grayscales of any two of the four sub-pixels. For example, if it is determined according to initial grayscales of three of the sub-pixels, then $$X = k*s*\rho \left( \frac{x_1^{Gamma} + x_2^{Gamma} + x_3^{Gamma}}{3} \right)^{\frac{1}{Gamma}},$$

where $x_1$, $x_2$, and $x_3$ represent initial grayscales of any three of the four sub-pixels. For example, if it is determined according to initial grayscales of the sub-pixels, then $$X = k*s*\rho \left( \frac{x_1^{Gamma} + x_2^{Gamma} + x_3^{Gamma} + x_4^{Gamma}}{4} \right)^{\frac{1}{Gamma}},$$

where $x_1$, $x_2$, $x_3$, and $x_4$ represent initial grayscales of the four sub-pixels.

Based upon the same inventive idea, an embodiment of this disclosure further provides a display device including the display substrate according to any one of the embodiments above of this disclosure. The display device can be a mobile phone, a tablet computer, a TV set, a monitor, a notebook computer, a digital photo frame, a navigator, or any other product or component with a display function. Reference can be made to an embodiment of the display substrate above for an implementation of the display device, and a repeated description thereof will be omitted here.

Optionally the display device according to an embodiment of this disclosure further includes a driver configured to drive the display substrate, where the driver of the display substrate can be an Integrated Circuit (IC), an external Central Processing Unit (CPU), a micro processor, etc., and is configured:

to receive raw image data;

for each sub-pixel in the first display sub-area, to determine a target grayscale of the sub-pixel according to an initial grayscale of a sub-pixel in the raw image data, corresponding to the sub-pixel;

for each sub-pixel in the second display sub-area, to determine a target grayscale of the sub-pixel according to a light-emitting area of the sub-pixel, the distribution density of pixels in the second display sub-area, and an initial grayscale of a sub-pixel in the raw image data, corresponding to an area including the sub-pixel; and to drive the respective sub-pixels in the display substrate to display at their target grayscales.

Optionally in the display device according to an embodiment of this disclosure, the driver is configured to determine for each sub-pixel in the first display sub-area the target grayscale of the sub-pixel by:

determining a target grayscale X corresponding to a first sub-pixel in the first display sub-area in the equation of $$X = \left( \frac{x_1^{Gamma} + x_2^{Gamma}}{2} \right)^{\frac{1}{Gamma}},$$

where Gamma represents a gamma value of the display substrate, which is generally 2.2, and $x_1$ and $x_2$ represent initial grayscales of two first sub-pixels in the raw image data, which correspond to the first sub-pixel respectively;

determining a target grayscale Y of a second sub-pixel in the first display sub-area as an initial grayscale y of a second sub-pixel in the raw image data, corresponding to the second sub-pixel; and determining a target grayscale Z corresponding to a third sub-pixel in the first display sub-area in the equation of $$Z = \left( \frac{z_1^{Gamma} + z_2^{Gamma}}{2} \right)^{\frac{1}{Gamma}},$$

where $z_1$ and $z_2$ represent initial grayscales of two third sub-pixels in the raw image data, which correspond to the third sub-pixel respectively.

In a particular implementation, in order to alleviate a dark strip at the interface between the second display sub-area and the first display sub-area, brightness in the second display sub-area can be adjusted as appropriate, where the brightness is in proportion to a light-emitting area and the distribution density of pixels.

Accordingly optionally in the display device according to an embodiment of this disclosure, the driver is configured to determine for each sub-pixel in the second display sub-area the target grayscale of the sub-pixel by:

determining the target grayscale X corresponding to the sub-pixel in the equation of $$X = k*s*\rho \left( \frac{x_1^{Gamma} + x_2^{Gamma} + \ldots + x_n^{Gamma}}{n} \right)^{\frac{1}{Gamma}},$$

where n is any integer ranging from 1 to N, N is the number of sub-pixels in the raw image data, which correspond to the sub-pixel, Gamma represents a gamma value of the display substrate, s represents the ratio of a light-emitting area of a sub-pixel in the first display sub-area to a light-emitting area of a sub-pixel in the second display sub-area, ρ represents the ratio of the distribution density of pixels in the first display sub-area to the distribution density of pixels in the second display sub-area, k is an error adjustment coefficient, and $x_n$ is an initial grayscale of the n-th sub-pixel in the raw image data, corresponding to the sub-pixel.

In a particular implementation, the error adjustment coefficient k can be adjusted according to a real display effect of the display substrate, although an embodiment of this disclosure will not be limited thereto.

A reference can be made to the implementation of the driver in the display device above for details of the method according to an embodiment of this disclosure.

In a particular implementation, in the display device according to an embodiment of this disclosure, the driver integrates all the algorithms for calculating the target grayscales of the sub-pixels in the respective sub-areas into an IC. In order to display an image, the driver determines the target grayscales corresponding to the respective sub-pixels according to the received image data.

Furthermore before the display substrates displays at the target grayscales, in order to improve the uniformity of brightness, generally a Demura algorithm shall also be performed. A particular Demura algorithm is known in the art, so a repeated description thereof will be omitted here.

Based upon the same inventive idea, an embodiment of this disclosure further provides a fine metal mask for fabricating the display substrate according to any one of an embodiments of this disclosure, where the fine metal mask includes a plurality of opening areas corresponding in shape and position to the first sub-pixels, the second sub-pixels, or the third sub-pixels.

Figure 12:
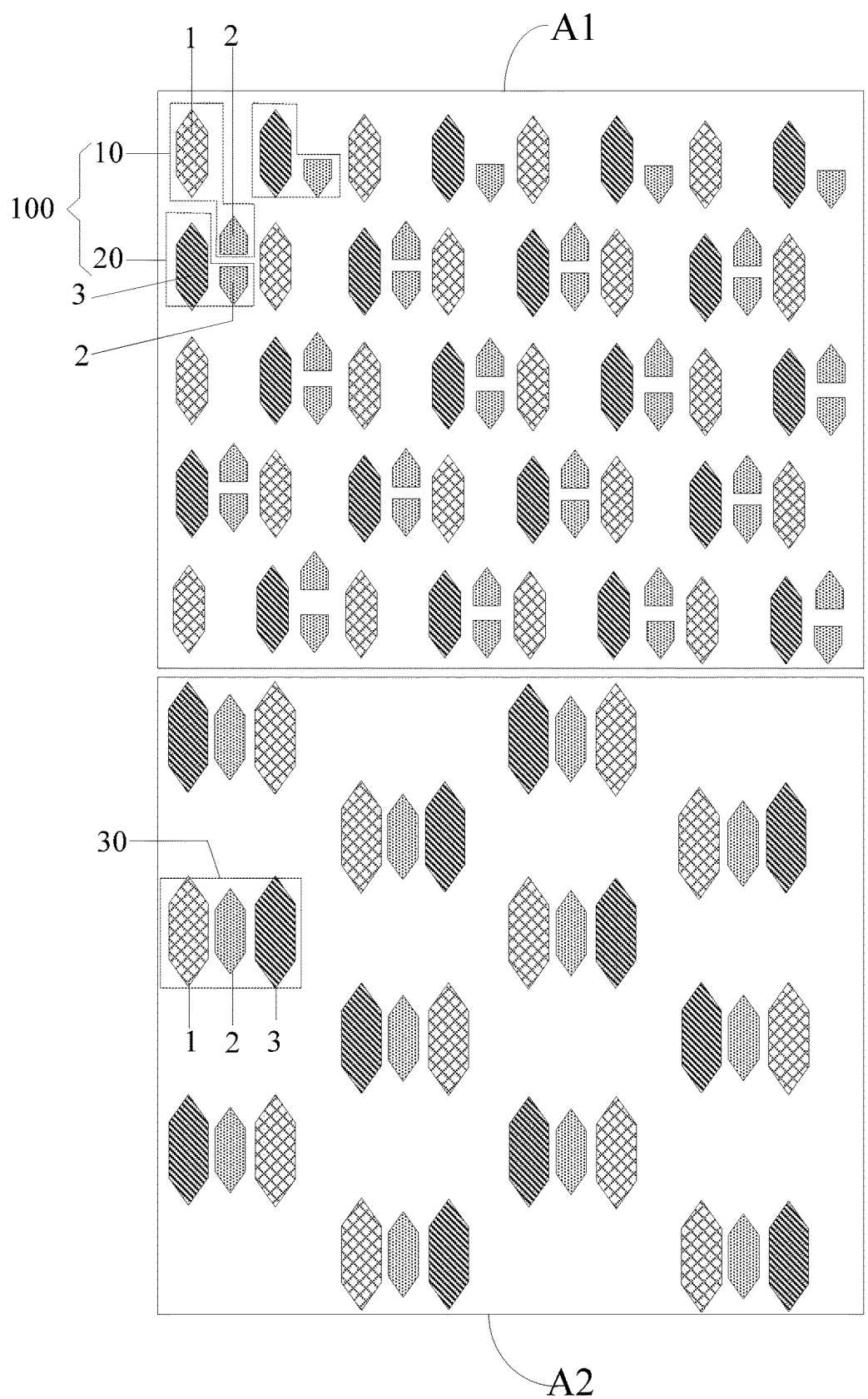
FIG. 12 is an eleventh schematic structural diagram of a part of the display substrate according to an embodiment of this disclosure.
Figure 16:
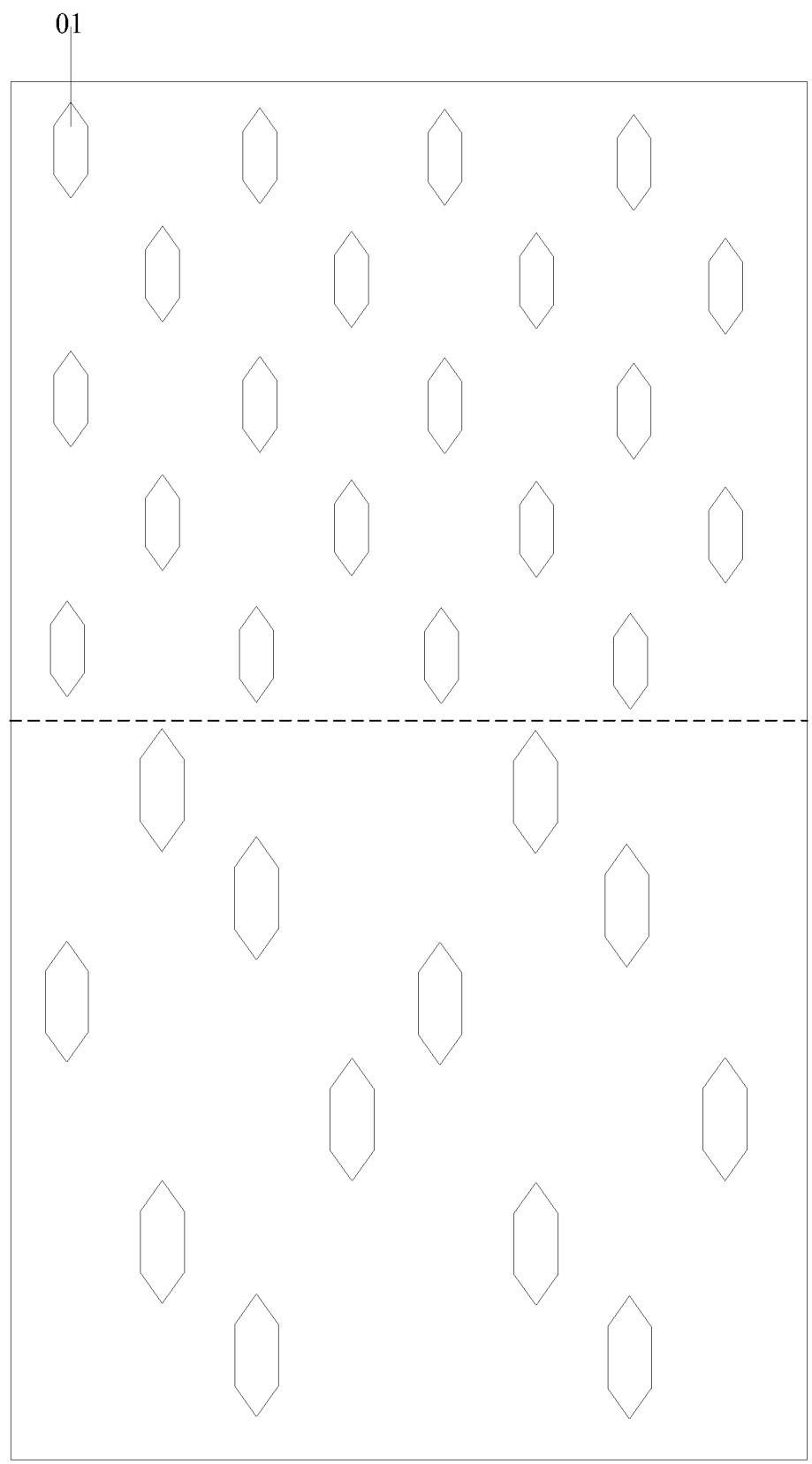
FIG. 16 is a schematic structural diagram of a fine metal mask according to an embodiment of this disclosure.

In a particular implementation, each sub-pixel generally includes an anode layer, a light-emitting layer, and a cathode layer, where the light-emitting layer is generally vapor-plated using the fine metal mask above. Taking the display substrate as illustrated in FIG. 12 as an example, the fine metal mask for forming the first sub-pixels includes opening areas 01 corresponding in shape and position to the light-emitting layers of the first substrate 1 in the display substrate as illustrated in FIG. 16. The area of an opening area 01 is generally larger than an area of a corresponding light-emitting area due to a limiting process factor. Principles of fine metal mask for forming the second sub-pixels, and the fine metal mask for forming the third sub-pixels are similar to the principle of the fine metal mask for forming the first sub-pixels, so a repeated description thereof will be omitted here.

In the display substrate, the method for driving the same, the display device, and the fine metal mask above according to the embodiments of this disclosure, the display area includes the first display sub-area with a high distribution density of pixels (i.e., a high resolution), and the second display sub-area with a low distribution density of pixels (i.e., a low resolution), and since the distribution density of pixels in the second display sub-area is low, a camera and another element can be arranged in the second display sub-area, that is, the distribution density of the local pixels can be lowered to thereby improve the transmittivity of a screen so as to improve a screen to panel ratio of the display substrate. Furthermore in order to drive the display substrate, the grayscale of a sub-pixel in the second display sub-area can be adjusted according to the light-emitting area of the sub-pixel, and the distribution density of pixels, in the second display sub-area to thereby compensate for a significant difference in brightness between the second display sub-area and the first display sub-area due to the difference between the distribution density of pixels in the first display sub-area, and the distribution density of pixels in the second display sub-area so as to alleviate a dark strip from occurring at the interface between the first display sub-area and the second display sub-area, so that the image can be displayed throughout the screen.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A display substrate, comprising a display area comprising a first display sub-area and a second sub-area, wherein:
   a distribution density of pixels in the first display sub-area is higher than a distribution density of pixels in the second display sub-area;
   wherein the first display sub-area comprises a plurality of first pixel elements and second pixel elements arranged adjacent to each other, wherein the first pixel elements and the second pixel elements are arranged alternately in a row direction, the first pixel elements comprise a first sub-pixel and a second sub-pixel, and the second pixel elements comprise a third sub-pixel and a second sub-pixel;
   the second display sub-area comprises a plurality of third pixel elements, and the third pixel elements comprise a first sub-pixel, a second sub-pixel, and a third sub-pixel arranged adjacent to each other;
   the second sub-pixel and the first sub-pixel in each first pixel element are arranged in a same row, and the second sub-pixel and the third sub-pixel in each second pixel element are arranged in a same row, in the first display sub-area; and
   for the first pixel element and the second pixel element adjacent in the row direction, the second sub-pixel in the first pixel element is not immediately adjacent to the second sub-pixel in the second pixel element.

2. The display substrate according to claim 1, wherein at least a part of sides of the second display sub-area coincide with at least a part of sides of the display area, and other sides of the second display sub-area are surrounded by the first display sub-area;
    wherein the first display sub-area and the second display sub-area are arranged in a row direction, or the first display sub-area and the second display sub-area are arranged in a column direction.

3. The display substrate according to claim 1, wherein the first display sub-area is arranged to surround the second display sub-area, or
    a shape of the second display sub-area is one of a round, a drop shape, a rectangle, and a trapezia, or
    the first display sub-area and the second display sub-area form a consecutive display area, and a shape of the display area is substantially a rectangle.

4. The display substrate according to claim 3, wherein in a case that the first display sub-area and the second display sub-area form a consecutive display area, and a shape of the display area is substantially a rectangle, the second display sub-area is located at a corner of the display area.

5. The display substrate according to claim 1, wherein an area of the second display sub-area is smaller than an area of the first display sub-area.

6. The display substrate according to claim 1, wherein sub-pixels in the second display sub-area are located in a same row as a part of sub-pixels in the first display sub-area, or
    sub-pixels in the second display sub-area are located in a same column as a part of sub-pixels in the first display sub-area, or
    a light-emitting area of a first sub-pixel in the second display sub-area is not smaller than a light-emitting area of a first sub-pixel in the first display sub-area;
    a light-emitting area of a second sub-pixel in the second display sub-area is not smaller than a light-emitting area of a second sub-pixel in the first display sub-area; and
a light-emitting area of a third sub-pixel in the second display sub-area is not smaller than a light-emitting area of a third sub-pixel in the first display sub-area,
or
    the plurality of third pixel elements are arranged in a matrix in the second display sub-area, or
    the plurality of third pixel elements are arranged in a tessellated pattern in the second display sub-area, or
    the first sub-pixel, the second sub-pixel, and the third sub-pixel in the third pixel element are arranged successively in the same row in the second display sub-area, or
    in the third pixel element in the second display sub-area, the first sub-pixel and the third sub-pixel are arranged in a same row, and the second sub-pixel is located in an adjacent row to the row in which the first sub-pixel and the third sub-pixel are located.

7. The display substrate according to claim 6, wherein in a case that in the third pixel element in the second display sub-area, the first sub-pixel and the third sub-pixel are arranged in a same row, and the second sub-pixel is located in an adjacent row to the row in which the first sub-pixel and the third sub-pixel are located, in a same third pixel element, an orthographical projection of a center of the second sub-pixel onto a line connecting a center of the first sub-pixel with a center of the third sub-pixel lies between the center of the first sub-pixel, and the center of the third sub-pixel.

8. The display substrate according to claim 1, wherein in the second display sub-area, the sub-pixels in two third pixel elements adjacent in the row direction are arranged in a same order in the row direction, and the sub-pixels in two third pixel elements adjacent in the column direction are arranged in opposite orders in the row direction, or
    the sub-pixels in the third pixel elements in the second display sub-area are arranged in a same order, or
    in the second display sub-area, the sub-pixels in the third pixel elements in a same column are arranged in a same order; and the sub-pixels in the third pixel elements in two adjacent columns are arranged in opposite orders, or
    shapes of the first sub-pixels, the second sub-pixels, and the third sub-pixels are substantially same in the second display sub-area.

9. The display substrate according to claim 8, wherein in a case that shapes of the first sub-pixels, the second sub-pixels, and the third sub-pixels are substantially same in the second display sub-area, a light-emitting area of a second sub-pixel is smaller than or substantially equal to a light-emitting area of a first sub-pixel, and a light-emitting area of a second sub-pixel is smaller than or substantially equal to a light-emitting area of a third sub-pixel, in the second display sub-area;
    wherein a light-emitting area of a first sub-pixel is substantially equal to a light-emitting area of a third sub-pixel in the second display sub-area.

10. The display substrate according to claim 1, wherein the first pixel elements and the second pixel elements are arranged alternately in a column direction, in the first display sub-area;
    wherein a light-emitting area of a first sub-pixel, a light-emitting area of a second sub-pixel, and a light-emitting area of a third sub-pixel are substantially same in the first display sub-area.

11. The display substrate according to claim 10, wherein the second sub-pixel and the first sub-pixel in the first pixel elements are staggered in rows and columns, and the second sub-pixel and the third sub-pixel in the second pixel elements are arranged in a same row; and
    the first pixel element and the second pixel element adjacent in the column direction are a group of pixels, and in a same group of pixels, the second sub-pixel in the first pixel element, and the third sub-pixel in the second pixel element are arranged in a same row, and the second sub-pixel in the first pixel element, and the second sub-pixel in the second pixel element are located in a same column.

12. The display substrate according to claim 11, wherein a light-emitting area of a second sub-pixel is not larger than a light-emitting area of a first sub-pixel, and a light-emitting area of a second sub-pixel is not larger than a light-emitting area of a third sub-pixel, in the first display sub-area;
    wherein two second sub-pixels in the same group of pixels are arranged adjacent to each other in the column direction, and the two second sub-pixels are arranged symmetric in the row direction;
    wherein shapes of the first sub-pixel and the third sub-pixel are substantially same, and a shape of a combination of two second sub-pixels is substantially same as the shape of the first sub-pixel, in the same group of pixels.

13. The display substrate according to claim 10, wherein the sub-pixels in the first pixel elements are arranged in a same order, and the sub-pixels in the second pixel elements are arranged in a same order, in the first display sub-area.

14. The display substrate according to claim 1, wherein a shape of at least one of a first sub-pixel and a third sub-pixel in the second display sub-area is substantially same as a shape of a first sub-pixel in the first display sub-area;
wherein a shape of one of a first sub-pixel and a second sub-pixel in the first display sub-area is substantially same as a shape of a second sub-pixel in the second display sub-area;
wherein the shape of the first sub-pixel is at least one of a rectangle and a hexagon.

15. A display device, comprising the display substrate according to claim 1.

16. A method for driving the display substrate according to claim 1, the method comprising:
receiving raw image data;
for the sub-pixels in the first display sub-area, determining a target grayscale of the sub-pixel according to an initial grayscale of a sub-pixel in the raw image data, corresponding to the sub-pixel;
for the sub-pixels in the second display sub-area, determining a target grayscale of the sub-pixel according to a light-emitting area of the sub-pixel, the distribution density of pixels in the second display sub-area, and an initial grayscale of a sub-pixel in the raw image data, corresponding to an area comprising the sub-pixel; and
driving the sub-pixels in the display substrate to display at the target grayscales.

17. The method according to claim 16, wherein determining for the sub-pixels in the first display sub-area the target grayscale of the sub-pixel comprises:
determining a target grayscale X corresponding to a first sub-pixel in the first display sub-area in an equation of $$X = \left(\frac{x_1^{Gamma} + x_2^{Gamma}}{2}\right)^{\frac{1}{Gamma}},$$

wherein Gamma represents a gamma value of the display substrate, and $x_1$ and $x_2$ represent initial grayscales of two first sub-pixels in the raw image data, which correspond to the first sub-pixel respectively;
determining a target grayscale Y of a second sub-pixel in the first display sub-area as an initial grayscale y of a second sub-pixel in the raw image data, corresponding to the second sub-pixel; and
determining a target grayscale Z corresponding to a third sub-pixel in the first display sub-area in an equation of $$Z = \left(\frac{z_1^{Gamma} + z_2^{Gamma}}{2}\right)^{\frac{1}{Gamma}},$$

wherein $z_1$ and $z_2$ represent initial grayscales of two third sub-pixels in the raw image data, which correspond to the third sub-pixel respectively.

18. The method according to claim 16, wherein determining for the sub-pixels in the second display sub-area the target grayscale of the sub-pixel comprises:
determining the target grayscale X corresponding to the sub-pixel in an equation of $$X = k*s*\rho\left(\frac{x_1^{Gamma} + x_2^{Gamma} + \ldots + x_n^{Gamma}}{n}\right)^{\frac{1}{Gamma}},$$

wherein n is any integer ranging from 1 to N, N is a quantity of sub-pixels in the raw image data, which correspond to the sub-pixel, Gamma represents a gamma value of the display substrate, s represents a ratio of a light-emitting area of a sub-pixel in the first display sub-area to a light-emitting area of a sub-pixel in the second display sub-area, ρ represents a ratio of the distribution density of pixels in the first display sub-area to the distribution density of pixels in the second display sub-area, k is an error adjustment coefficient, and $x_n$ is an initial grayscale of the n-th sub-pixel in the raw image data, corresponding to the sub-pixel.

19. A fine metal mask for fabricating the display substrate according to claim 1 wherein the fine metal mask comprises a plurality of opening areas corresponding in shape and position to the first sub-pixels, the second sub-pixels, or the third sub-pixels.

20. A display substrate, comprising a display area comprising a first display sub-area and a second sub-area, wherein:
a distribution density of pixels in the first display sub-area is higher than a distribution density of pixels in the second display sub-area;
wherein the first display sub-area comprises a plurality of first pixel elements and second pixel elements arranged adjacent to each other, wherein the first pixel elements comprise a first sub-pixel and a second sub-pixel, and the second pixel elements comprise a third sub-pixel and a second sub-pixel;
the second display sub-area comprises a plurality of third pixel elements, and the third pixel elements comprise a first sub-pixel, a second sub-pixel, and a third sub-pixel arranged adjacent to each other;
the first pixel elements and the second pixel elements are arranged alternately in a column direction, and the first pixel elements and the second pixel elements are arranged alternately in a row direction, in the first display sub-area;
the second sub-pixel and the first sub-pixel in the first pixel elements are staggered in rows and columns, and the second sub-pixel and the third sub-pixel in the second pixel elements are arranged in a same row; and
the first pixel element and the second pixel element adjacent in the column direction are a group of pixels, and in a same group of pixels, the second sub-pixel in the first pixel element, and the third sub-pixel in the second pixel element are arranged in a same row, and the second sub-pixel in the first pixel element, and the second sub-pixel in the second pixel element are located in a same column.

* * * * *